US012165857B2

(12) United States Patent
Schneider et al.

(10) Patent No.: US 12,165,857 B2
(45) Date of Patent: Dec. 10, 2024

(54) MAGNET SYSTEM, SPUTTERING DEVICE AND METHOD

(71) Applicant: VON ARDENNE Asset GmbH & Co. KG, Dresden (DE)

(72) Inventors: Klaus Schneider, Arnsdorf (DE); Goetz Grosser, Dresden (DE); Thorsten Sander, Dresden (DE); Ralf Hauswald, Bad Schandau (DE)

(73) Assignee: VON ARDENNE Asset GmbH & Co. KG, Dresden (DE)

( * ) Notice: Subject to any disclaimer, the term of this patent is extended or adjusted under 35 U.S.C. 154(b) by 69 days.

(21) Appl. No.: 18/054,562

(22) Filed: Nov. 11, 2022

(65) Prior Publication Data
US 2023/0154732 A1 May 18, 2023

(30) Foreign Application Priority Data
Nov. 12, 2021 (DE) ..................... 10 2021 129 521.1

(51) Int. Cl.
H01J 37/34 (2006.01)
C23C 14/34 (2006.01)
(52) U.S. Cl.
CPC ...... H01J 37/3405 (2013.01); C23C 14/3407 (2013.01); H01J 37/3464 (2013.01)
(58) Field of Classification Search
None
See application file for complete search history.

(56) References Cited

U.S. PATENT DOCUMENTS

| 6,494,999 B1 * | 12/2002 | Herrera ............... C23C 14/3407 204/192.12 |
| 2003/0046976 A1 * | 3/2003 | Hanazaki ............... G01N 21/68 118/723 R |
| 2004/0094327 A1 * | 5/2004 | Sato ..................... H01J 37/248 174/137 R |
| 2004/0178056 A1 | 9/2004 | De Bosscher et al. |
| 2006/0231394 A1 | 10/2006 | Barrett |

(Continued)

FOREIGN PATENT DOCUMENTS

DE 102010040759 A1 3/2012
DE 102011075543 A1 11/2012

(Continued)

OTHER PUBLICATIONS

International Search Report issued for the corresponding Belgian patent application No. 2023/05394, dated Nov. 29, 2023, 9 pages (for informational purposes only).

(Continued)

Primary Examiner — Jason Berman
(74) Attorney, Agent, or Firm — VIERING, JENTSCHURA & PARTNER MBB

(57) ABSTRACT

Disclosed herein are systems, devices, and methods for a magnet system for a sputtering device. The disclosed magnet system may include a housing having a housing interior. The magnet system may also include a magnet holder disposed in the housing interior and supported by the housing in a preferably stationary manner. The magnet system may also include a dehumidifying device adjacent to or disposed in the housing interior for drying the housing interior.

20 Claims, 11 Drawing Sheets

(56) References Cited

U.S. PATENT DOCUMENTS

| | | | | |
|---|---|---|---|---|
| 2006/0272174 A1* | 12/2006 | Hartig | ................... | C23C 14/564 34/80 |
| 2018/0030591 A1* | 2/2018 | Saitou | ................. | H01J 37/3497 |
| 2020/0006091 A1* | 1/2020 | Dsaak | .................... | F26B 5/042 |

FOREIGN PATENT DOCUMENTS

| | | |
|---|---|---|
| DE | 102017101867 A1 | 8/2018 |
| DE | 102018102693 A1 | 8/2019 |
| EP | 2785152 A1 | 10/2014 |
| EP | 3137646 A1 | 3/2017 |
| JP | 2013140684 A | 7/2013 |
| JP | 2018053272 A | 4/2018 |
| JP | 2019163501 A | 9/2019 |
| WO | 2015167687 A1 | 11/2015 |

OTHER PUBLICATIONS

International Search Report issued for the corresponding Belgian patent application No. 2023/5393, dated Nov. 28, 2023, 16 pages (for informational purposes only).

Search report issued for corresponding Belgian patent application No. 2022/5769, dated Apr. 3, 2023, 20 pages (for informational purposes only).

German Search Report issued for the corresponding German patent application No. 10 2021 129 521.1, dated Feb. 26, 2022, 10 pages (only for informational purposes).

\* cited by examiner

MAGNET SYSTEM, SPUTTERING DEVICE AND METHOD

CROSS-REFERENCE TO RELATED APPLICATION(S)

This application claims priority to German Patent Application No. 10 2021 129 521.1, filed on Nov. 12, 2021, the contents of which are fully incorporated herein by reference.

TECHNICAL FIELD

Various embodiments relate to a magnet system, a sputtering device, and a method.

BACKGROUND

In general, workpieces or substrates may be processed, e.g., machined, coated, heated, etched, and/or structurally modified. For example, one process for coating a substrate is cathode sputtering (referred to as sputtering), which is of the physical vapor deposition (PVD) type. By means of sputtering (i.e. by means of a sputtering process), for example, one layer or plurality of layers may be deposited on a substrate. For this purpose, a plasma-forming gas may be ionized by means of a cathode, and a material to be deposited (target material) may be sputtered by means of the plasma formed in the process. The atomized target material may then be brought to a substrate on which it may be deposited and form a layer.

Modifications of cathode sputtering are sputtering by means of a magnetron, so-called magnetron sputtering, or so-called reactive magnetron sputtering. Here, the formation of the plasma may be supported by means of a magnetic field. To generate the magnetic field, a magnet system may be or be arranged on the target material or on the cathode (then also referred to as magnetron cathode), so that a toroidal plasma channel, a so-called racetrack, may be formed on the surface of the target material (target surface), in which plasma may be formed. In this process, the target material may be sputtered in the area (also referred to as the sputtering area) exposed to the plasma in the plasma channel. In reactive magnetron sputtering, the sputtered target material is additionally chemically reacted and a resulting reaction product is deposited as a layer on the substrate.

BRIEF DESCRIPTION OF THE DRAWINGS

In the drawings, like reference characters generally refer to the same parts throughout the different views. The drawings are not necessarily to scale, emphasis instead generally being placed upon illustrating the exemplary principles of the disclosure. In the following description, various exemplary aspects of the disclosure are described with reference to the following drawings, in which.

DESCRIPTION

Figure 1:
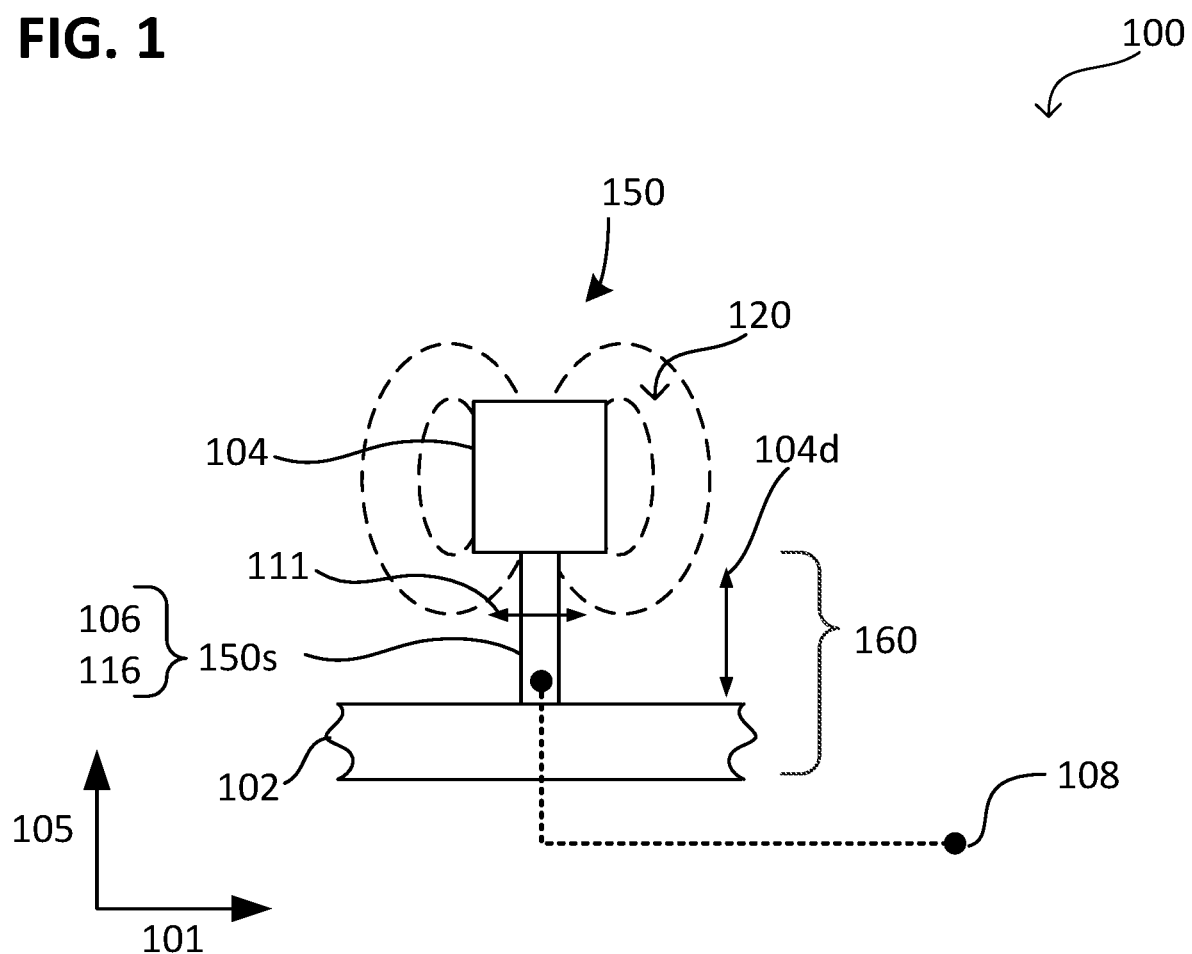
FIGS. 1 and 2 each show a magnet system according to different embodiments in different views.

The following detailed description refers to the accompanying drawings that show, by way of illustration, exemplary details and features.

With respect to magnetic fields and sputtering, the spatial distribution of the plasma channel or the associated atomization rate depends very sensitively on the spatial distribution of the magnetic field. Therefore, the magnet system is of special importance with respect to various process properties, such as process stability, reproducibility, target utilization and homogeneity. Against this background, there is a fundamental need to improve the magnet system, for example to simplify it and/or to reduce disturbing influences. For example, in an electrically adjustable magnet system, the aim is to protect the magnets and the electrical components from moisture (e.g. in the case of water cooling).

According to various embodiments, a magnet system and a sputtering device are provided in which sensitive components of the magnet system are better protected from moisture to maintain the functionality of the magnet system over an extended period of time. In other words, the reliability and service life of the magnet system are improved, and the susceptibility to failure is reduced.

For this purpose, the magnet system illustratively comprises a housing, the housing interior of which (also referred to as the inner housing) may be dehumidified by means of a dehumidifying device (e.g., comprising a condensate separator) and/or the housing interior of which is filled with a fluid having a low water content (e.g., a dehumidified gas). With respect to the implementation of the dehumidifying device, reference is made herein primarily to a condensation trap, and what is described with respect thereto may apply by analogy to other implementations of the dehumidifying device.

Illustratively, it was recognized that during assembly and maintenance, the housing may be opened, allowing moist air to enter the housing. Likewise, moisture may enter the housing through small leaks. This moisture introduced into the housing may condense inside (e.g. on cold surfaces) and cause corrosion damage to sensitive components.

In the following detailed description, reference is made to the accompanying drawings which form part thereof and in which are shown, for illustrative purposes, specific embodiments in which the invention may be practiced. In this regard, directional terminology such as "top", "bottom", "forward", "rearward", "front", "rear", etc. is used with reference to the orientation of the figure(s) described. Because components of embodiments may be positioned in a number of different orientations, the directional terminology is for illustrative purposes and is not limiting in any way. It is understood that other embodiments may be used and structural or logical changes may be made without departing from the scope of protection. It is understood that the features of the various exemplary embodiments described herein may be combined, unless otherwise specifically indicated. Therefore, the following detailed description is not to be construed in a limiting sense, and the scope of protection is defined by the appended claims.

In the context of this description, the terms "connected", "attached" as well as "coupled" are used to describe both a direct and an indirect connection (e.g. ohmic and/or electrically conductive, e.g. an electrically conductive connection), a direct or indirect connection as well as a direct or indirect coupling. In the figures, identical or similar elements are given identical reference signs where appropriate.

According to various embodiments, the term "coupled" or "coupling" may be understood in the sense of a (e.g. mechanical, hydrostatic, thermal and/or electrical), e.g. direct or indirect, connection and/or interaction. For example, a plurality of elements may be coupled together along an interaction chain along which the interaction may be exchanged, e.g., a fluid (then also referred to as fluidically coupled). For example, two coupled elements may exchange an interaction with each other, e.g., a mechanical, hydrostatic, thermal, and/or electrical interaction. A coupling of a plurality of vacuum components (e.g., valves, pumps, chambers, etc.) to each other may have them fluidically coupled to each other. According to various embodiments, "coupled" may be understood in the sense of a mechanical (e.g., bodily or physical) coupling, e.g., by means of direct physical contact. A coupling may be configured to transmit a mechanical interaction (e.g., force, torque, etc.).

The term "bearing device" as used herein means a device (for example comprising an assembly) configured for bearing (e.g. guided positioning and/or holding) one or more than one component. The bearing device may comprise, for example per component (which is supported by means thereof), one or more than one bearing for supporting (e.g. guided positioning and/or holding) the component. Each bearing of the bearing device may be configured to provide the component with one or more than one degree of freedom (for example, one or more than one translational degree of freedom and/or one or more than one rotational degree of freedom) according to which the component may be moved. Examples of a bearing include: Radial bearing, thrust bearing, radial-axial bearing, linear bearing (also referred to as linear guide).

The term "sputtering" refers to the atomization of a material (also referred to as coating material or target material), which is provided as a so-called target, by means of a plasma. The atomized components of the target material are thus separated from each other and may be deposited elsewhere, for example to form a layer. Sputtering may be performed by means of a so-called sputtering device, which may have a magnet system (in which case the sputtering device is also referred to as a magnetron). For sputtering, the magnetron may be placed in a vacuum processing chamber so that sputtering may be performed in a vacuum. To this end, the environmental conditions (the process conditions) within the vacuum processing chamber (e.g., pressure, temperature, gas composition, etc.) may be adjusted or controlled during sputtering. For example, the vacuum processing chamber may be or may be configured to be air-tight, dust-tight, and/or vacuum-tight, such that a gas atmosphere having a predefined composition or pressure (e.g., according to a set point) may be provided within the vacuum processing chamber. For example, an ion-forming gas (process gas) or a gas mixture (e.g., of a process gas and a reactive gas) may be or are provided within the vacuum processing chamber. In a reactive magnetron sputtering process, for example, the atomized material may react with a reactive gas (e.g., comprising oxygen, nitrogen, and/or carbon) and the resulting reaction product (e.g., a dielectric) may be deposited.

Sputtering may be performed by means of a so-called tubular magnetron, in which a tubular target (also referred to as a tube target or tubular cathode) rotates axially around the magnet system. The tube target may, for example, comprise a tube on which the target material may be fixed as a layer on an outer circumferential surface of the tube and may partially cover the circumferential surface of the tube. However, the tube target may also be formed from the target material. By adjusting the magnet system or by changing the magnetic field generated thereby, the atomization of the target material and thus the spatial distribution with which the target is removed may be influenced.

A main component of a tubular magnetron is the magnet system, which forms the magnetic field of the racetrack. The strength of the magnetic field over the length of the tube target has a significant influence on the homogeneity of the deposited functional layer on the substrate. By varying the field strength in individual areas, the layer homogeneity may thus be selectively adjusted. For this reason, the magnet arrangements are designed in such a way that the distance between magnet and target surface may be adjusted.

The tubular cathode and magnet system may be supported by means of a bearing device (also referred to as a target bearing device) that rotatably supports the tubular cathode relative to the magnet system, for example. The bearing device may have, for example, one or more than one end block, each end block of the bearing device holding an end portion of the tubular cathode and magnet system, respectively. The bearing device (e.g., its one or more than one end block) may further provide a supply of electrical power, rotary motion, and/or cooling fluid to the tubular cathode. Optionally, the sputtering device, or bearing device thereof, may also be configured to hold two targets along with the magnet system disposed therein (also referred to as a double magnetron) when the sputtering device is configured in a double tube configuration.

According to various embodiments, an end block (then also referred to as a drive end block) of the sputtering device may include a drive train for transmitting rotational motion to the tubular cathode, which may be coupled to a drive, for example. Alternatively or additionally, an end block (also referred to as a media end block) of the sputtering device may be configured to supply and discharge cooling fluid (e.g., a water-based mixture) that may be passed through the cathode.

However, exactly one end block (also referred to as a compact end block) may be used, which has the drive train and fluid line and thus provides the functions of a drive end block and a media end block together. For example, the side of the tubular target opposite the compact end block may be freely cantilevered (i.e., freely suspended), which is referred to as a cantilever configuration. The compact end block may be mounted in cantilever configuration to a side wall of the vacuum chamber through which the axis of rotation of the tubular target extends. However, the side of the tube target opposite the compact end block may also be supported by means of a bearing block (illustratively a thrust bearing), which is referred to as a bearing block configuration. The bearing block may also be provided by means of a passive end block, i.e. an end block which does not exchange energy or material with the tube target, but only supports it.

According to various embodiments, the magnet system may have a length (extent along the longitudinal extent, longitudinal direction, and/or axis of rotation of the target) in a range from 0.5 m (meters) approximately to approximately 6 m, e.g., in a range from 2 m approximately to approximately 5 m and/or greater than 3 m.

The magnet system may be multipolar, i.e., have multiple magnetic poles. Of the plurality of magnetic poles, a first magnetic pole (also referred to as an outer pole) may extend along a self-contained path (also referred to as a circulatory path) and a second magnetic pole may be disposed within the area enclosed by the circulatory path (also referred to as an inner pole). The circulatory path may be oval-shaped, for example.

Each magnetic pole may have a plurality of pole bodies, e.g. magnets (then also referred to as a row of magnets or magnet row), lined up in series, each pole body being magnetized or having a magnetization. For example, each row of magnets may have at least 10 (e.g., at least 100) pole bodies, e.g., magnets, per meter. For example, each magnetic pole may have one or more than one magnetic row. For example, three rows of magnets arranged between the end pieces of the magnet system may provide substantially the center region of the magnet system (illustratively one row as the inner pole, one row of magnets on each side of the inner pole as the outer pole).

As used herein, the term "pole body" means a body having or formed from a magnetic material (also referred to as magnet material). For example, the pole body may be adjacent to or part of a magnetic pole. The magnetic material may be, for example, ferromagnetic or ferrimagnetic. The magnet material may comprise or be formed from hard-magnetic magnet material and/or soft-magnetic magnet material. The magnet material may have a magnetic polarization, such as a magnetization, such that a dipole is provided.

For example, the hard-magnetic magnet material may have a coercive field strength greater than about 500 kilo-amperes per meter (kA/m), such as greater than about 1000 kA/m. The hard magnetic magnet material may, for example, be part of or form part of one or more than one permanent magnet (also referred to as a constant magnet). A permanent magnet (also referred to as a constant magnetic pole body) may be understood to be a body of a hard-magnetic magnet material. The hard-magnetic magnet material may, for example, comprise a chemical compound and/or an alloy.

For example, the hard magnetic magnet material may comprise the elements iron, cobalt, and/or nickel (e.g., a ferrite). The hard magnetic magnet material may comprise or be formed from a rare earth metal (such as neodymium, samarium, praseodymium, dysprosium, terbium, and/or gadolinium), iron, cobalt, and/or nickel. For example, the hard-magnetic magnet material may comprise or be formed from at least neodymium, iron, and/or boron, e.g., a chemical compound thereof. Alternatively or additionally, the hard magnetic magnet material may comprise or be formed from at least aluminum, nickel, and/or cobalt, e.g., a chemical compound thereof. Alternatively or additionally, the hard magnetic magnet material may comprise or be formed from at least samarium and/or cobalt, e.g. a chemical compound thereof.

For example, the hard magnetic magnet material may comprise or be formed from neodymium-iron-boron ($Nd_2Fe_{14}B$) or samarium-cobalt ($SmCo_5$ and $Sm_2Co_{17}$). More generally, the hard magnetic magnet material (e.g., the or each permanent magnet) may comprise or be formed from a rare earth magnet material (such as neodymium-iron-boron (NdFeB) or samarium-cobalt (SmCo)), a ferrite magnet material (e.g., a hard ferrite magnet material), a bismanol magnet material, and/or an aluminum-nickel-cobalt magnet material.

For example, the soft-magnetic magnet material may have a coercivity of less than about 500 kA/m, e.g., of less than about 100 kA/m, e.g., of less than about 10 kA/m, e.g., of less than about 1 kA/m. The soft magnetic magnet material may comprise or be formed from, for example, an alloy of iron, nickel, and/or cobalt, steel, a powder material, and/or a soft ferrite (e.g., comprising nickel tin and/or manganese tin).

For example, the magnetic (e.g., soft magnetic and/or hard magnetic) material may have a magnetic permeability of about 10 or more, e.g., about 100 or more, e.g., about $10^3$ or more, e.g., about $10^4$ or more, e.g., about $10^5$ or more.

In general, the outer pole and the inner pole may be spaced apart and/or may differ from each other in their magnetization direction and/or in their number of magnets. In the simplest case, the magnetization directions of the outer pole and inner pole are exactly opposite, e.g., antiparallel. However, in more complex implementations, they may be skewed with respect to each other, e.g., including an angle (also referred to as magnetization deviation). For example, the magnetization deviation may be about 90° or more (e.g., 120° or more, e.g., 150° or more, e.g., 160° or more, e.g., 170° or more, e.g., about 180°).

In an exemplary implementation, the inner pole may be magnetized toward and/or away from the target material on a (e.g., magnetic) magnet holder, and the outer pole may be magnetized away from the (e.g., magnetic) magnet holder and/or toward the target material. Alternatively, the outer pole may be magnetized toward and/or away from the (e.g., magnetic) magnet holder and the inner pole may be magnetized away from the (e.g., magnetic) magnet holder and/or toward the target material. In an exemplary implementation, the outer pole and the inner pole, e.g., their magnetization directions, may be configured (e.g., aligned and/or arranged) such that they provide (optionally together with the magnetic material in the environment), a tunnel-like to parallel magnetic field line path to the target surface.

A magnet may be understood herein as an exemplary pole body comprising a magnetized material having a magnetization and being illustratively configured as a permanent magnet. For example, the magnet may comprise a rare earth magnet (such as neodymium-iron-boron (NdFeB)) or samarium-cobalt (SmCo)), a ferrite magnet, a bismanol magnet, and/or an aluminum-nickel-cobalt magnet. What is described herein with respect to magnets may apply by analogy to pole bodies of other types.

The magnet system (e.g., its magnet bar) may optionally comprise a plurality of sequentially arranged and/or spatially separated (e.g., multi-pole) segments (also referred to as magnet system segment or as magnet system group), of which two segments (also referred to as reversing segments or end pieces) are arranged at the end faces (illustratively at the magnet system end) of the magnet system and of which one or more than one optional segment (also referred to as center piece) is arranged between the end pieces. For example, in each center piece, the circulatory path may have two rectilinear sections between which the inner pole is disposed. In each of the end pieces, the circulatory path may be arcuate and/or angled. Reference is made herein, by way of example, to a magnet system having a plurality of magnet system groups, although what is described with respect thereto may also apply to an unsegmented magnet system, or what is described with respect to one magnet system group may apply by analogy to a plurality of magnet system groups, and vice versa.

The term "non-magnetic" may be understood to mean substantially magnetically neutral, e.g., also slightly paramagnetic or diamagnetic. For example, the term "non-magnetic" may be understood as having a magnetic permeability of substantially 1, i.e., in a range from about 0.9 to about 1.1. Examples of a non-magnetic material include: Graphite, aluminum, platinum, copper, aluminum, non-magnetic stainless steel, a ceramic (e.g., an oxide).

FIG. 1 illustrates a magnet system 100 according to various embodiments in a schematic detailed view, e.g., looking at the direction 101 (also referred to as reference direction 101) along which the magnet system 100 is longitudinally extended.

The magnet system 100 may include a plurality of magnets 104 and a support structure 160 (also referred to as a support structure) configured to support the magnets 104 of the magnet system 100. The support structure 160 may include at least one (i.e., one or more than one) carriers 102, 202 (also referred to as magnet holders), a first carrier 102 (also referred to as a first magnet holder or system carrier) of which is configured to support one or more than one magnet system group 150 of the magnet system 100 (e.g., magnets 104 thereof).

For example, the magnet system 100 may have one or more than one magnet system group 150 per system support 102, e.g., may have a plurality of magnet system groups 150 per system support 102. For example, the magnet system 100 may have (e.g., per system support 102) 2 magnet system groups 150 or more, e.g., may have 3 magnet system groups 150 or more.

Each magnet system group 150 may include a plurality (e.g., three or more) of magnets 104 and may optionally be configured to be adjustable. For example, a magnet 104 of a magnet system group 150 may have a magnetization, e.g., either with a direction (also referred to as a magnetization direction) toward or away from the system support 102. At least two magnets 104 per magnet system group 150 may differ in their magnetization direction.

Examples of components or implementations of the system support 102 include: a tube (e.g., a lance tube), a plate (e.g., a sheet), a section member, or the like. For example, the system support 102 may comprise or consist of a sectional support, e.g., comprising a U-section, e.g., comprising a double U-section (also referred to as an H-section).

Each adjustably configured magnet system group 150 may include an adjustment device 150s, for example, disposed (e.g., partially) between the system support 102 and the magnet(s) 104 of the magnet system group 150. The adjustment device 150s may be configured to change a spatial distribution of the magnetic field 120 generated by the magnet system group 150, for example by changing a spatial distribution (e.g., position and/or orientation) of the magnet(s) 104 of the magnet system group 150.

For example, the adjustment device 150s may be a component of the support structure 160 and configured to change the spatial position and/or orientation of at least one magnet of the magnet system 100.

Exemplary components of the adjustment device 150s include: a bearing device 116 (also referred to as a group bearing device) and/or an actuator 106 (e.g., purely mechanical or electromechanical). The adjustment device 150s (e.g., its group bearing device 116 and/or actuator 106) may couple the or each magnet 104 of the magnet system group 150 to the system support 102.

Alternatively, the adjustment of the magnet system 100 is performed, for example, manually by changing the distance 104d of the magnet 104 from the system support 102 (also referred to as magnet distance 104d), for example, by means of inserting one or more than one shims or by means of the purely mechanical actuator 106, for example, a threaded spindle. Alternatively, an electrical adjustment (also referred to as mechanical adjustment) of the magnet system may be performed by means of the electromechanical actuator 106, by changing the magnet distance 104d by means of the electromechanical actuator 106 (e.g. comprising a threaded spindle drive), whereby here a distinction may be made between an in-situ and an ex-situ adjustment.

If one or more than one magnet system group 150 of the magnet system 100 is configured to be adjustable, or if the magnet system 100 comprises one or more than one adjustment device 150s, the support structure 160 may comprise, e.g. per magnet system group 150, a second carrier 202 (also referred to as a second magnet holder or as a group carrier) configured to support the plurality of magnets 104 (cf. also FIG. 2) of the magnet system group 150. In that case, the or each group carrier 202 may be magnetic (then providing the so-called return carrier) and the system carrier 102 may be non-magnetic. If the magnet system 100 does not have a group carrier 202, the system carrier 102 may be magnetic (then providing the so-called return carrier). In some embodiments, the return carrier may be plate-shaped or include at least one plate (then also referred to as a return plate).

The group bearing device 116 may provide one or more than one translational degrees of freedom 111 to the magnets 104, of which a first translational degree of freedom 111 may be along the reference direction 101 and/or one or more than one second translational degrees of freedom may be transverse to the reference direction 101.

The actuator 106 may be configured to mechanically move the magnets 104 according to the or each translational degree of freedom 111 (also referred to as actuation). To this end, the actuator 106 may be coupled to the magnet 104 and the system support 102 such that when the actuator 106 is actuated, an attitude (i.e., orientation and/or position) of the magnet 104 relative to the system support 102 may be changed, e.g., according to a desired state.

To generate the motion, the actuator 106 may include an electromechanical transducer (e.g., an electric motor or piezoelectric actuator). The electromechanical transducer may be configured to generate translational motion (e.g., in the case of a linear electric motor) or to generate rotational motion (e.g., in the case of a rotary electric motor). To transmit motion to the magnets 104, the actuator 106 may optionally include a gearbox (also referred to as an actuator).

To supply electrical power (also referred to as supply power) to the actuator 106 and/or to supply a control signal to the actuator 106, the actuator 106 may be coupled to one or more than one electrical line 108. In principle, the control signal and the supply power may be supplied together via one line 108. However, they may also be supplied via separate lines 108.

For example, the or each magnet system group 150 of the magnet system 100 may include a plurality of magnets 104, e.g., per actuator 106. For example, the magnet system group 150 may include (e.g., per actuator 106) at least three magnets 104 or more, e.g., at least six magnets 104 or more, e.g., at least 9 magnets 104 or more, e.g., at least 12 magnets 104 or more, e.g., at least 15 magnets 104 or more, e.g., at least 2 1 magnets 104 or more, e.g., at least 30 magnets 104 or more.

Figure 2:
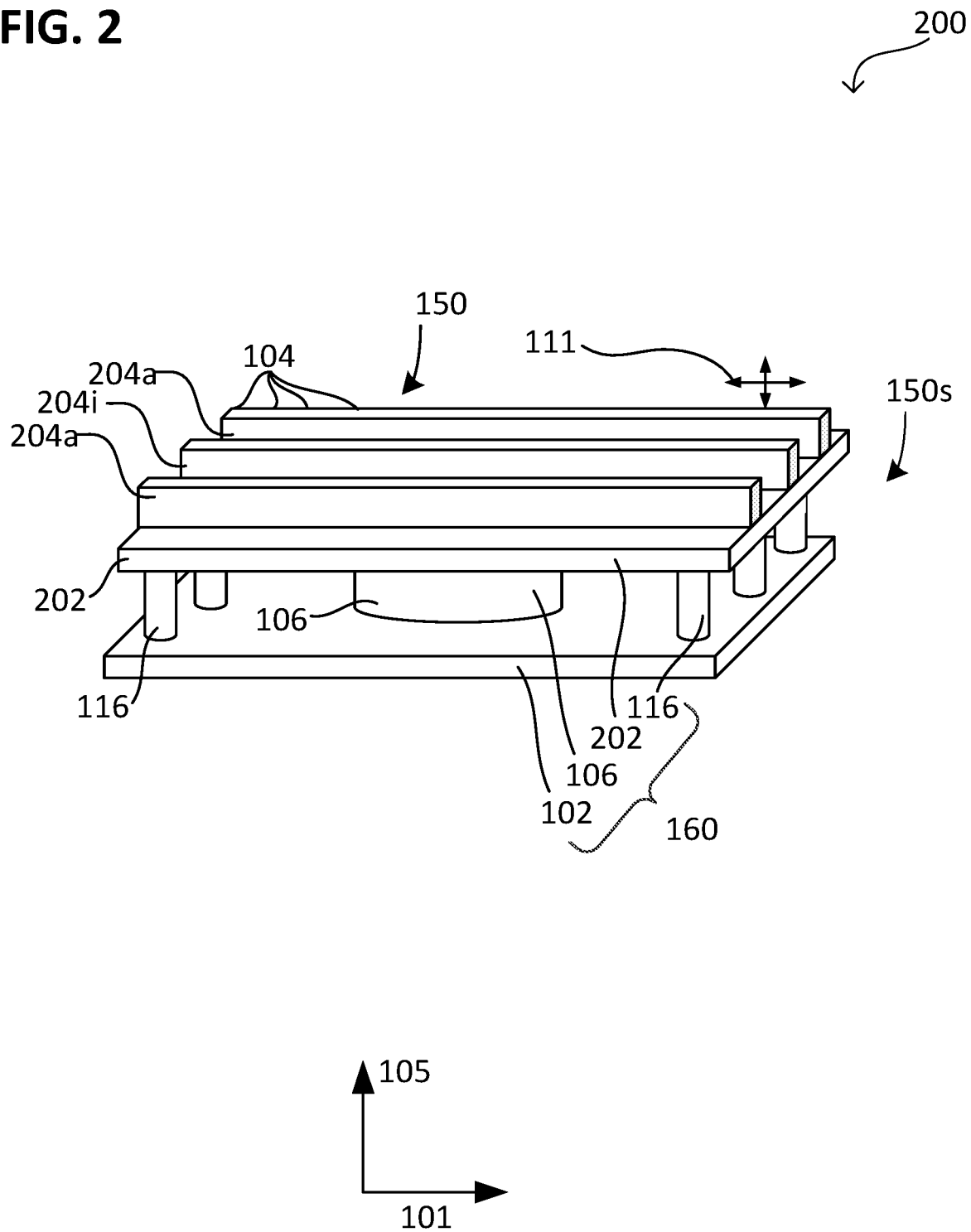

FIG. 2 illustrates the magnet system 100 according to various embodiments 200 in a schematic perspective view.

According to various embodiments, the magnet system 100, e.g., each of its magnet system groups 150, may comprise a plurality of magnet rows 204a, 204i, e.g., three magnet rows arranged in rows and spatially separated from each other, which are mounted on (e.g., magnetically coupled to) a common group carrier 202. Each of the magnet rows 204a, 204i may have a plurality of magnets of one magnetization direction arranged in series. The magnets may be arranged and aligned such that the adjacent rows of magnets 204a, 204i have opposite magnetization directions with respect to each other. For example, the outer two rows of magnets 204a may be magnetized away from the system support 102, where the centrally disposed row of magnets 204*i* may be magnetized toward the system support 102 (or vice versa).

At least the middle magnet row 204, which is arranged between two outer magnet rows 204, may be longitudinally extended in direction 101. Alternatively or additionally, a gap extending longitudinally in direction 101 (also referred to as direction 101 of the longitudinal extension) may be arranged between two directly adjacent magnet rows 204, which separates them spatially from each other.

Figure 3A:
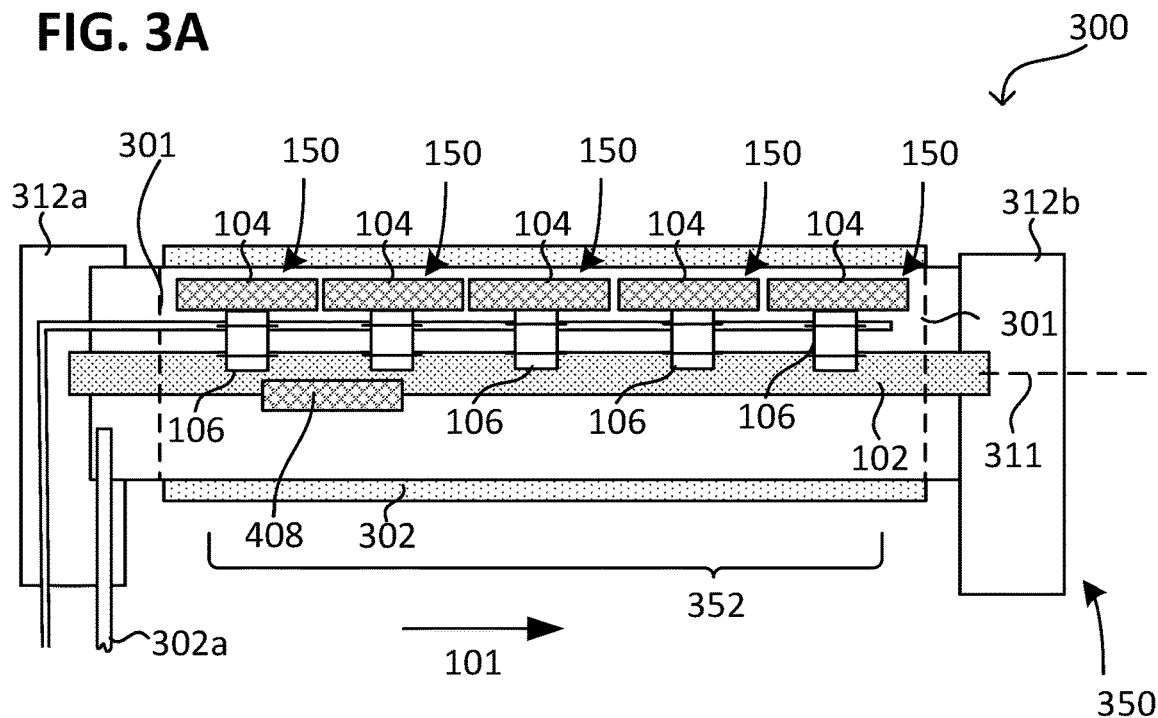
FIG. 3A shows a sputtering device according to various embodiments, and FIG. 3B, a magnet system of the sputtering device.
Figure 3B:
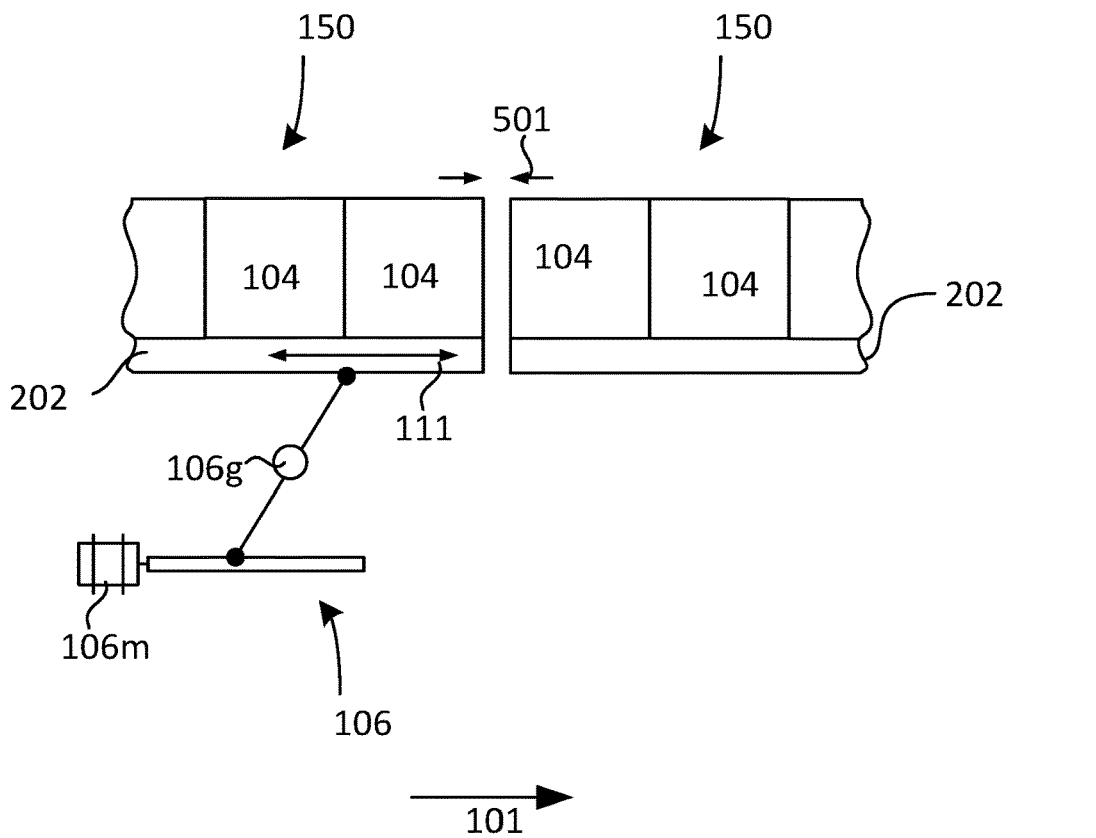

FIG. 3A illustrates a sputtering device 300 according to various embodiments in a schematic side view or cross-sectional view, and FIG. 3B illustrates the magnet system 100 of the sputtering device 300 in a schematic detailed view 300*b*.

The sputtering device 300 may include a bearing device 350 (also referred to as a target bearing device) for rotatably supporting a tubular target 302 (also referred to as a tube target). The target bearing device 350 may include one or two end blocks 312*a*, 312*b*, wherein the tubular target 302 may be rotatably supported by means of the end blocks 312*a*, 312*b*, for example about an axis of rotation 311. To this end, the target bearing device 350 (e.g., each end block 312*a*, 312*b*) may include one or more than one corresponding pivot bearing. Per pivot bearing, for example, a target coupling 301 (e.g., comprising a flange) may be rotatably supported to which the tubular target 302 may be coupled. The axis of rotation 311 may be along direction 101.

A first end block 312*a* of the target bearing device 350 may be configured as a drive end block 312*a*, i.e., having a drive train 302*a* for rotating the tubular target 302. A second end block 312*b* of the target bearing device 350 or the first end block 312*a* may be configured as a media end block 312*b*, i.e., for supplying and discharging a cooling fluid (e.g., comprising water) and/or for supplying electrical power to the tubular cathode 302. The cooling fluid may be passed through the tubular target 302, e.g., after being supplied to the magnet system 100.

The drive train 302*a* may be coupled to or include a drive device (e.g., a motor) disposed outside of the drive end block 312*a*. By means of the drive train 302*a*, torque may be coupled to the tubular target 302 for driving rotational movement of the tubular target 302.

Further, the sputtering device 300 may include the magnet system 100 held by means of the bearing device 350, e.g., stationary and/or rotationally fixed. For example, the magnet system 100 may remain in a fixed orientation with respect to the bearing device 350 as the tubular target 302 rotates (around the system support 102). The axis of rotation 311 or direction 101 may be parallel to a longitudinal extent of the system support 102. The axis of rotation 311 may optionally be disposed within the magnet system 100.

The bearing device 350 may comprise a target coupling 301 per end block 312*a*, 312*b* by means of which the tubular target 302 may be coupled, e.g. to the drive train 302*a* and/or to the cooling fluid supply (e.g. comprising one or more than one fluid line). For example, the target coupling 301 may include a releasable connection that may allow mounting and dismounting of the tubular target 302.

Detail 300*b* illustrates an exemplary pair of magnet system assemblies 150, each magnet system assembly comprising an assembly support 202; a plurality of magnets 104 coupled together (e.g., magnetically) by the assembly support 202; and an electrical actuator 106 configured to adjust the position of the assembly supports 202 and/or the magnets 104 relative to the system support 102 and/or relative to each other in response to the electrical control signal provided to the actuator 106. For example, the actuator 106 may be configured to impart translational motion (e.g., along or across direction 101) to one of the two magnet system assemblies 150. The actuator 106 includes, for example, an electric motor 106*m* and an optional gearbox 106*g*. The gearbox 106*g* may couple the motor 106*m* to the group support 202.

According to various embodiments, the magnet system 100 comprises a dehumidifying device 360, which increases the reliability and the service life of the magnet system 100 or reduces the susceptibility of the magnet system 100 to faults, as explained below for an exemplary scenario (see also the following FIG. 4). During sputtering, heat loss may occur near the racetrack or at the target 302, which may be at least partially absorbed by means of the cooling fluid (e.g. water) in the target 302 (also referred to as tempering the target). This is realized, for example, by passing the cooling fluid through the tubular target 302. Since the magnet system 100 is also arranged in the tubular target 302, it may be advantageous if the magnet system 100 or at least components thereof, if not themselves resistant to the cooling fluid, are protected from the cooling fluid, e.g. by means of an encapsulation of the magnet system 100 or at least components thereof.

If the magnet system 100 or the magnet distance 104*d* is adjusted manually, the magnet system 100 is often in direct contact with the cooling fluid or only the magnets are separated from the cooling fluid by a waterproof cover or at least protected against moisture. If the magnet system 100 or the magnet spacing 104*d* is electrically adjusted, the magnet system 100 has one or more than one electrical (or electronic) component (e.g., comprising a circuit) that need not necessarily be resistant to the cooling fluid. In this case, the magnet system 100 may include a (e.g., completely closed or sealed) system chamber 406 (see also FIG. 5 below) disposed in the target 302 through which the cooling fluid flows. In the system chamber 406 (illustratively protected from the cooling fluid), for example, the magnets 104 and/or one or more than one component 402 of the magnet system 100 may be arranged.

In general, it should be noted that what is described herein may apply by analogy to various configurations of the target bearing device 350. For example, in a tubular magnetron, the tubular target 302 is rotatably supported by one or more than one bearing device of the target bearing device 350. Exemplary components of the target bearing device 350 include: two end blocks 312*a*, 312*b* providing two bearing locations; exactly one end block without an abutment providing one bearing location, exactly one end block and exactly one bearing block (illustratively providing the abutment) providing two bearing locations. All these configurations of the target bearing device 350 have in common that the cooling fluid is supplied and discharged on one side, i.e. at one bearing location, or end block. To achieve uniform cooling of the tubular target 302, according to various embodiments, a tube-in-tube design is advantageous. The tube-in-tube design features that one or plurality of inner tubes initially transported the cooling fluid to the other side of the tube target 302, from where it flows back along the inner side of the tube target 302, with the cooling fluid, for example, absorbing the heat loss via the inner tube wall of the tube target 302 and transporting it away. The direction of flow may be varied.

Exemplary implementations of the dehumidifying device 360 are explained below.

Figure 4:
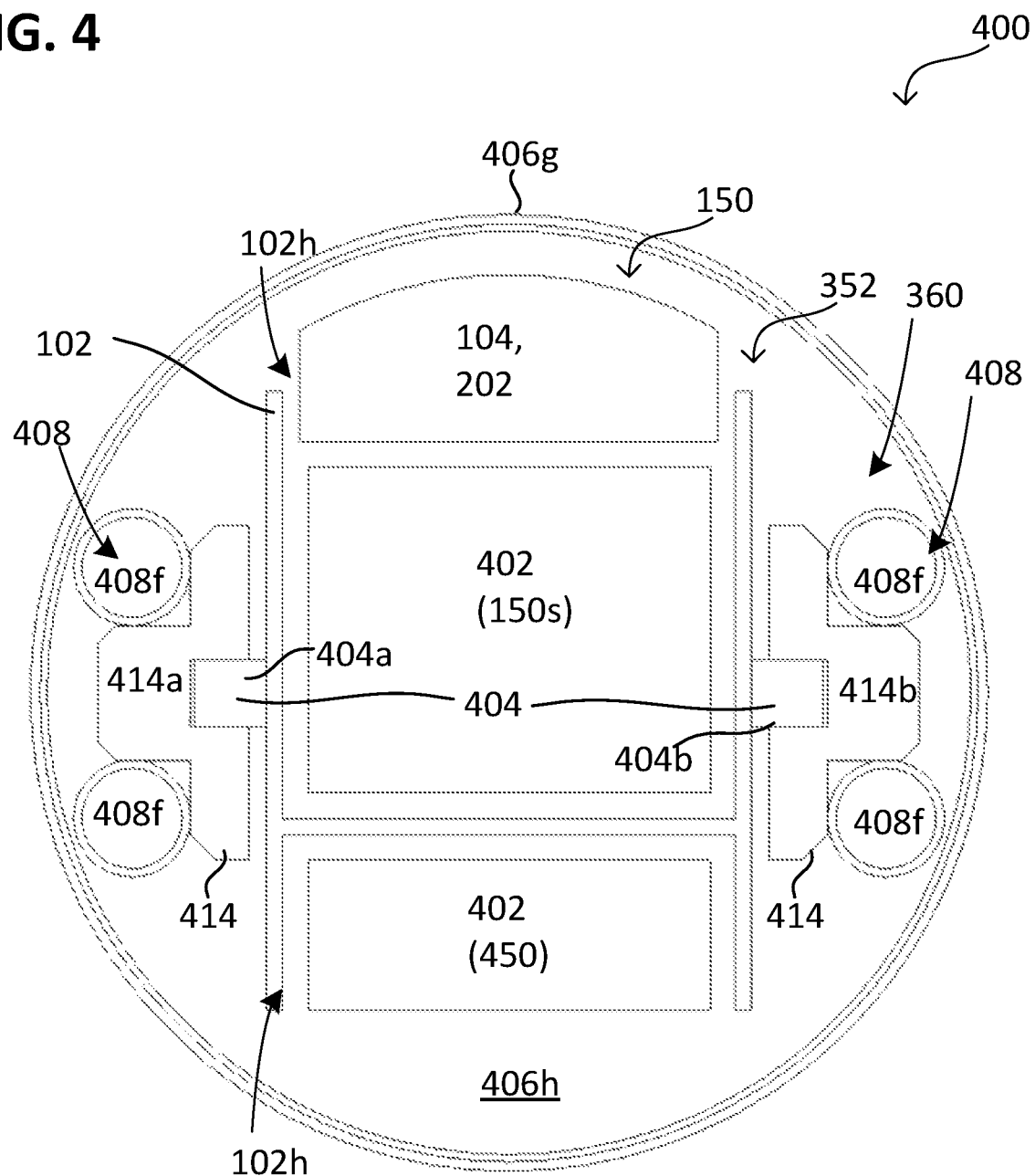
FIGS. 4 through 9 each show a magnet system according to various embodiments in various views.
Figure 4:
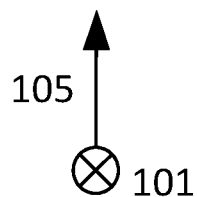

FIG. 4 illustrates the magnet system 100 according to various embodiments 400 in a schematic side view or cross-sectional view (looking along the reference direction), in which the magnet system 100 includes a longitudinally extending magnet bar 352 (also referred to as a magnet bar).

The magnet bar 352 includes the support structure 160 and the plurality of magnets 104, for example, the system support 102 and a magnet system group 150 or a plurality of magnet system groups 150 arranged in series (arranged along the longitudinal extent of the magnet bar 352 or the axis of rotation 311).

As explained above, the system support 102 may comprise or consist of a profile support, for example with a U-profile, e.g. (as shown) a double U-profile (also referred to as H-profile), or the like. The U-section (or double U-section) allows for high stability and provides one or more than one cavity 102h that provides installation space for one or more than one component 402 of the magnet system 100. Examples of the component 402 of the magnet system 100 include: the actuator 150s or at least its actuator 106 and/or group bearing device 116, an electrical component 450. Examples of the electrical component 450 include: a processor or other circuit, a generator, an inverter, the electromechanical actuator 106 or other electromechanical transducer.

Figure 8:
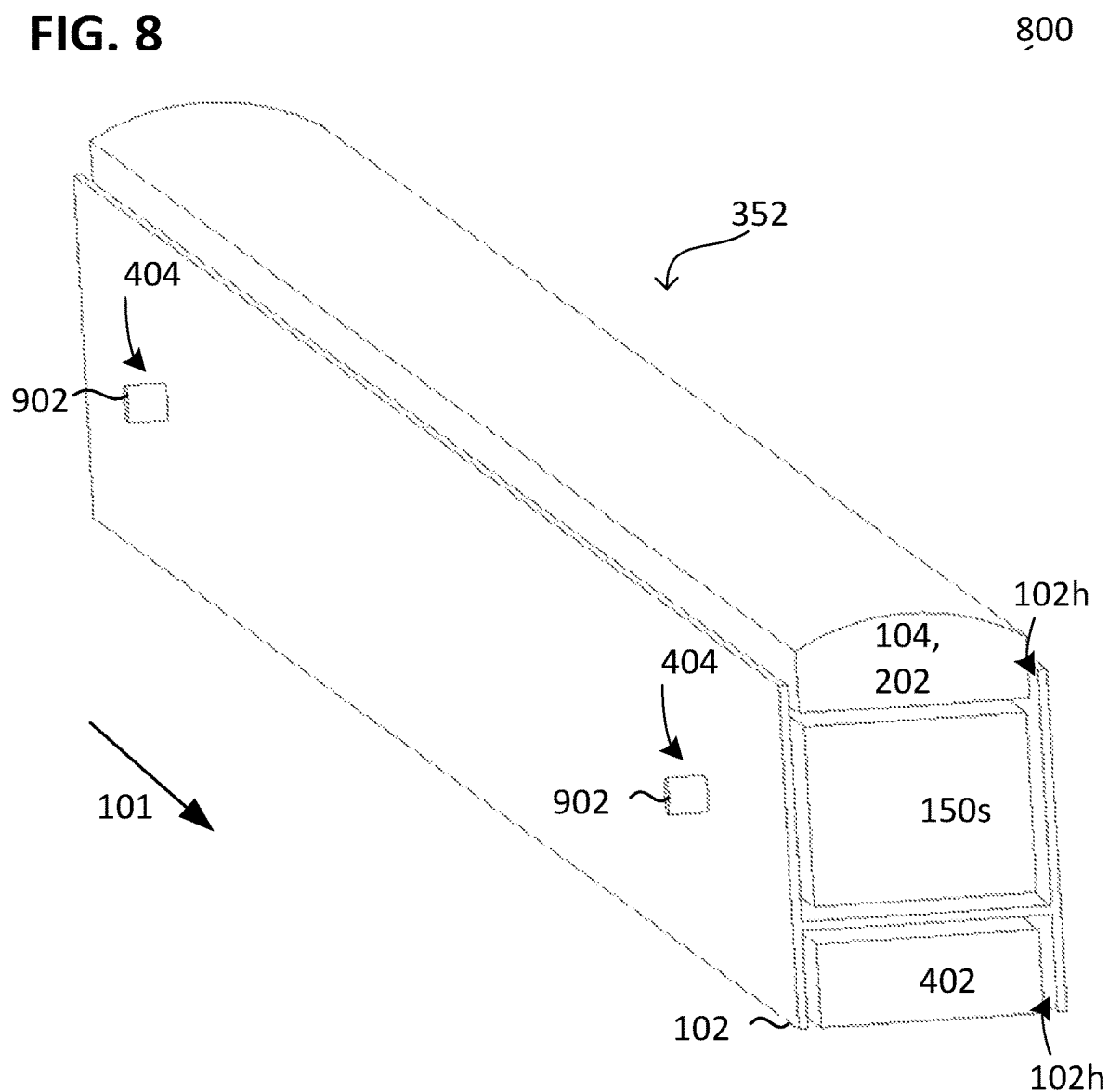

In some, but not necessarily all, embodiments, the magnet system 100 includes a base frame 414 (also referred to as a storage frame 414) and one or more than one support device 404, e.g., a first support device 404 and a second support device 404 (see also FIG. 8).

The or each support device 404 may be mounted to the magnet bar 352 (e.g., the system support 102 thereof) and, when joined together (e.g., interlocked) with the bearing rack 414, may form a bearing (e.g., floating bearing) for the magnet bar 352. For example, the bearing rack 414 and the support device 404 may be mated together to form a bearing point (e.g., a floating bearing). Optionally, the magnet bar 352 may be provided with multiple bearing points (also referred to as multi-point bearings) by means of a plurality of support devices 404 mounted to the magnet bar 352 and joined to the bearing frame 414. For example, the bearing frame 414 may include two bearing components 414a, 414b (also referred to as base frame bearing components) between which the magnet bar 352 is disposed, in which case the or each support device 404 includes one support component 404a, 404b per bearing component 414a, 414b between which the magnet bar 352 is disposed.

Further, the magnet system 100 comprises: a housing 406g (illustratively a hollow body) having a housing interior 406h in which the magnet bar 352 (or at least its magnet holder 102) is disposed, and/or a dehumidifying device 360 comprising a condensation trap 408. The condensation trap 408 may be adjacent to or at least partially (i.e., partially or fully) disposed within the housing interior 406h and configured for dehumidifying (also referred to as dehumidifying) the housing interior 406h. For example, the condensation trap 408 may include one or more than one fluid conduit 408f, such as two or more (e.g., three, four, or more than four) fluid conduits 408f.

In an exemplary implementation, the condensation trap 408 comprises one or more than one pair of fluid lines 408f between which a base frame bearing component 414a, 414b (e.g., a guide rail) or at least a portion of the base frame bearing component 414a, 414b is disposed. Alternatively or additionally, the condensation trap 408 has one or more than one fluid conduit 408f that contacts, e.g., is optionally connected to, the base frame 414, e.g., its base bearing component(s) 414a, 414b. This increases the heat transfer between them, the surface area of the condensate separator, and/or the rigidity of the bearing rack 414.

In a particularly simple and cost-effective implementation, the housing 406g is tubular (e.g., comprising a housing tube). This increases the compactness and/or rigidity of the magnet system 100.

For example, the system carrier 102 has a carrier profile and supports each array carrier 202 (e.g., each back plate 202) of the magnet system 100, the magnets 104 supported by means of each array carrier 202, and the optional electrical or electronic components 402. This increases the compactness and/or rigidity of the magnet system 100.

The volume of the interior of the housing 406h may be less than 100 l (liters), e.g., in a range from about 4 l to about 40 l, e.g., greater than about 10 l and/or less than about 20 l.

Figure 5:
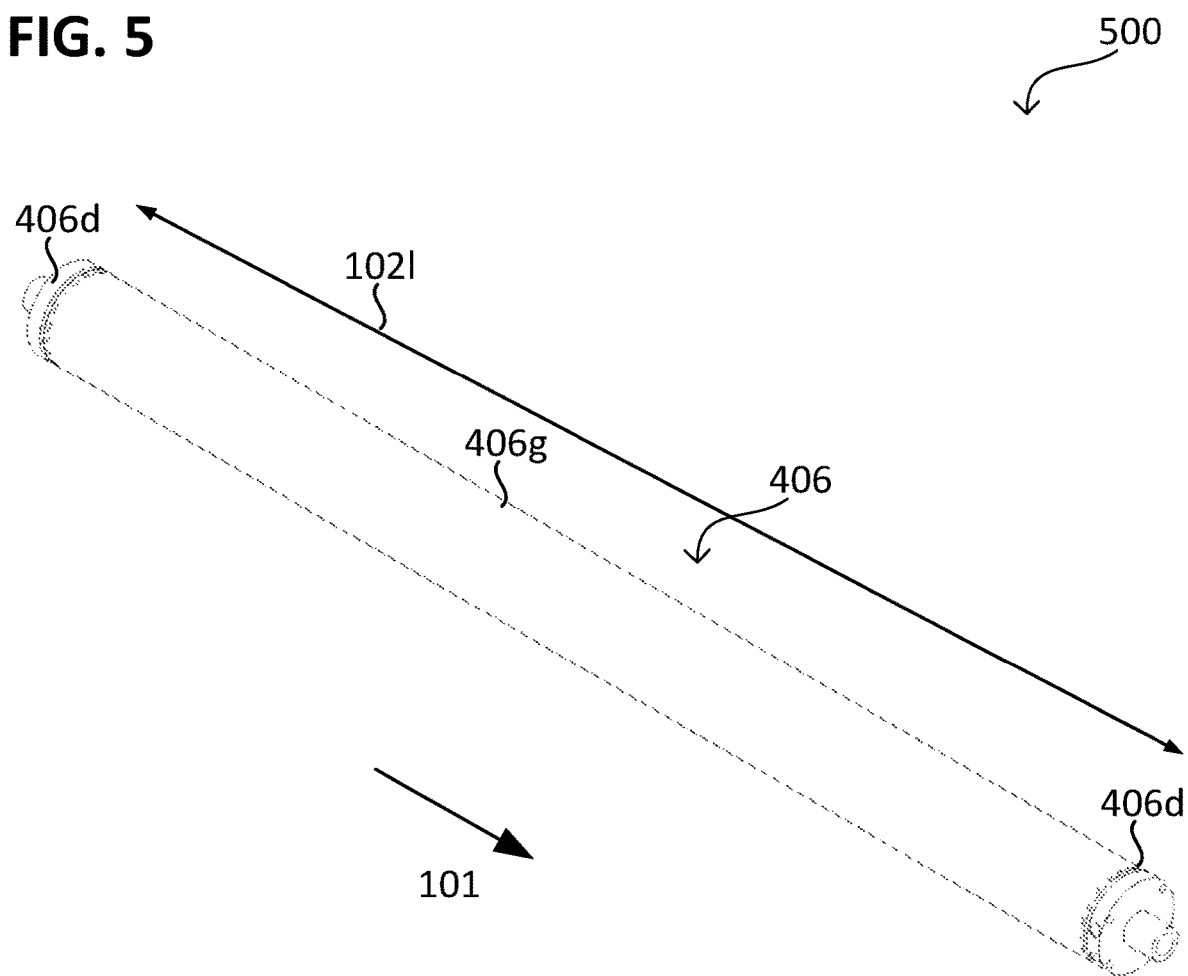

FIG. 5 illustrates the magnet system 100 according to various embodiments 500 in a schematic side view or cross-sectional view, in which the magnet system 100 comprises a (e.g., fluid-tight, e.g., vacuum-tight) chamber 406 (also referred to as the system chamber 406) comprising the housing 406g (also referred to as the chamber housing) and one or more than one lid 406d (also referred to as the terminal lid 406d or housing cover 406d). For example, the system chamber 406 may include two port lids 406d (also referred to as first port lid 406d and second port lid 406d) (also referred to as a two-lid configuration), between which the housing tube 406g is disposed.

The or each cover 406d may be configured to close (e.g., fluid-tight, e.g., vacuum-tight) the housing 406g at the end (e.g., from or in the direction of the longitudinal extent of the magnet bar 352 or axis of rotation 311). Optionally, at least one connection lid 406d of the system chamber 406 may be configured to supply the or each magnet system group 150 of the magnet system 100 (then also referred to as a supply lid), e.g., with mechanical energy and/or electrical energy. To this end, the supply cover 406d may include a gear stage, a generator, a communication interface, and/or a rotary coupling (e.g., a rotor through-coupling or a rotary union).

Figure 6:
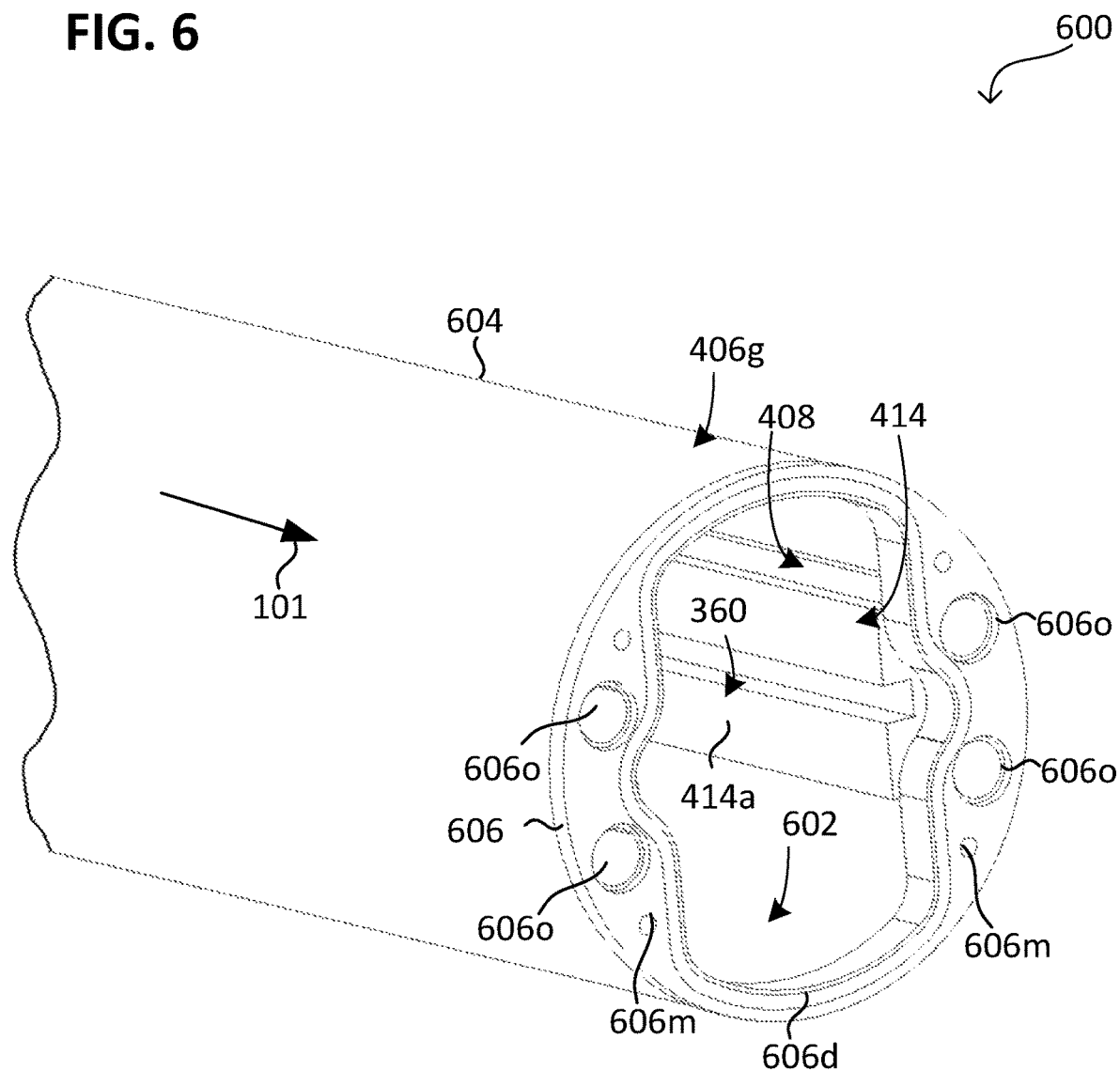

FIG. 6 illustrates the magnet system 100 according to various embodiments 600 in a schematic perspective view looking at a front face of the housing 406g. The housing 406g may have one or more than one opening 602 (also referred to as housing opening 602) on the front side, which exposes the housing interior 406h and may be covered by means of the optional connection cover 406d if required. The housing 406g may be supported by means of the target bearing device 350, e.g., disposed or received between the bearing points thereof (e.g., the end blocks 312a, 312b).

In an exemplary implementation, the tubular housing 406g comprises a tube 604 (also referred to as a housing tube 604) and one or more than one flange 606 (e.g., one flange 606 per housing opening 602), each flange 606 being connected (e.g., welded) to an end face of the housing tube 604 in a watertight manner and/or being penetrated by the housing opening 602. Each flange 606 of the housing 406g includes a sealing surface 606d and one or more than one mounting area 606m (e.g., each including threads), each mounting area 606m of which is configured to mate with a terminal cover 406d such that the terminal cover 406d may be mounted to the mounting area 606m (to axially secure the terminal covers).

Optionally, each flange 606 of the housing 406g has one or more than one port 606o (also referred to as a port opening 606o), of which a fluid line 408f (e.g., a tube) of the condensation trap 408 opens into each port opening 606o. For example, the housing 406g may include two or more (e.g., three, four, or more than four) port openings 406o per flange 606. Each of the fluid lines 408f may be, for example, connected (e.g., welded) to the flange 606 in a watertight manner and/or coupled to the guide rail.

Figure 7:
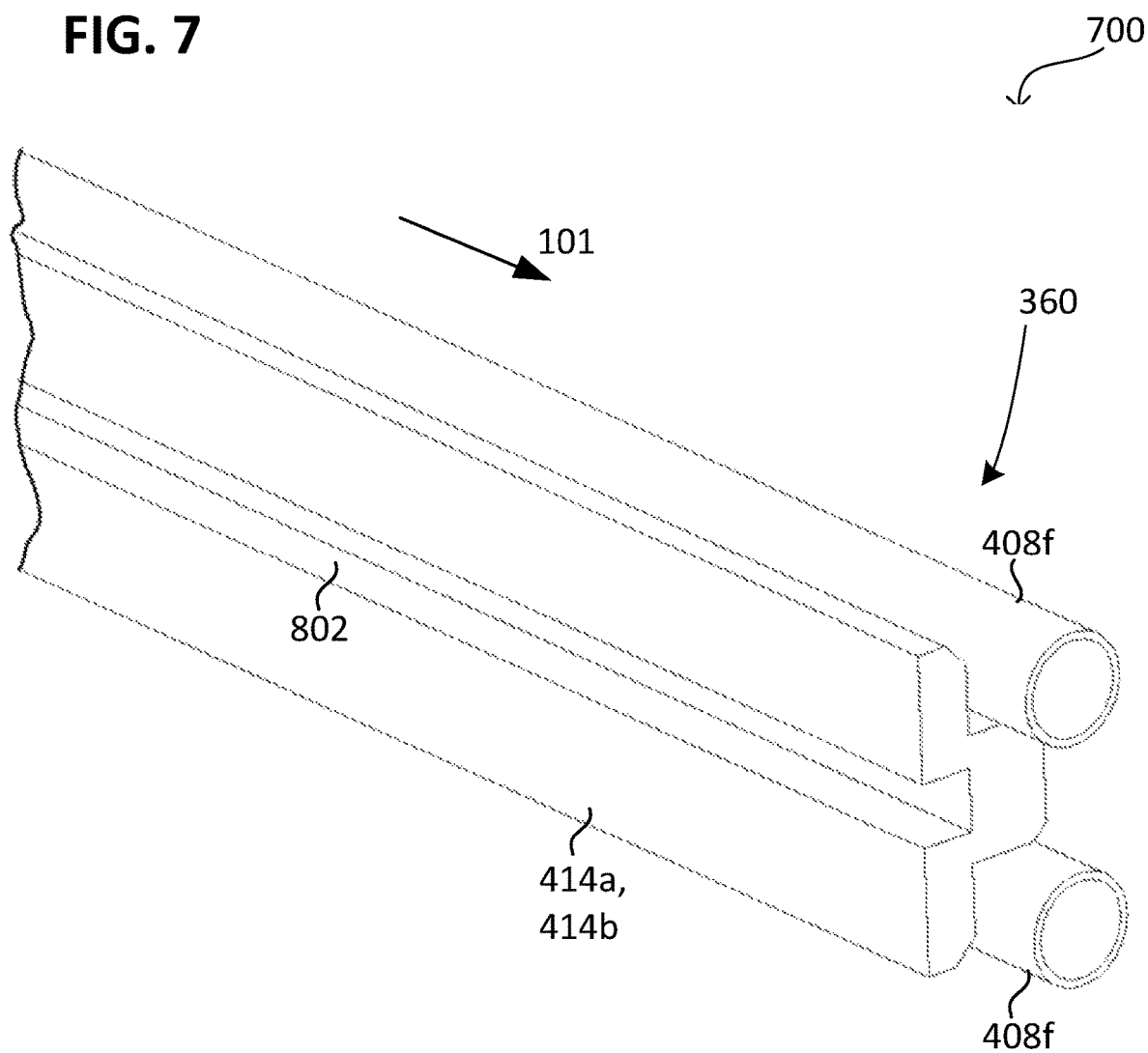

FIG. 7 illustrates the magnet system 100 according to various embodiments 700 in a schematic perspective detail view of a base frame bearing component 414a, 414b configured as a guide rail.

For example, the or each guide rail 414a, 414b has a grooved profile and/or is coupled (e.g., welded) to each fluid line (e.g., line pipe) of a pair of fluid lines 408f of the condensation trap 408. This coupling simultaneously increases the stiffness of the guide rail(s).

The groove profile facilitates insertion of the system support 102, on which the one or more than one support device 404 is mounted, into the housing 406g. For example, the system carrier 102 on which the one or more than one support device 404 is mounted may be inserted into the housing 406g in a face-to-face manner such that each support device 404 engages the groove of the groove profile (also referred to as a guide groove) and is slid along the groove into the housing 406g.

In an exemplary implementation, the system chamber 406 includes the housing tube 604 with flanges 606 welded to both sides in a watertight manner. The flanges 606 include a sealing surface 606d and threads 606m for axial attachment of the port covers 406d. Furthermore, four pipes are welded into the flanges 606 in a watertight manner as fluid lines 408f, which are optionally connected to the bearing rack 414 or at least one guide rail 414a, 414b thereof. The bearing rack 414 or each guide rail 414a, 414b thereof is, for example, connected to one of the flanges 606 only via end welds so that there need be no contact between the bearing rack 414 or its guide rail(s) 414a, 414b and the housing tube 604 at which heat transfer may occur. However, in longer embodiments of the magnet system 100 (for example, from about 2 meters longitudinal extension of the magnet system 100), it may be advantageous to provide an additional connection of the bearing rack 414 or its guide rail(s) 414a, 414b with the housing tube 604, for example by a spot weld connection in the center of the tube, in order to reduce the deformation of the bearing rack 414 or its guide rail(s) 414a, 414b by their own weight. Another possibility of support is to insert a contour plate into the housing tube 604, which creates a positive connection between the bearing rack or its guide rail(s) 414a, 414b and housing tube 604.

For example, the bearing rack 414 may include two guide rails 414a, 414b, each guide rail having a grooved profile and being connected (e.g., welded) to two fluid lines 408f (e.g., line pipes). This improves the heat absorption of the condensation trap 408 and/or increases the condenser area.

FIG. 8 illustrates the magnet system 100 according to various embodiments 800 in a schematic perspective detail view of a face of the magnet bar 352, in which each support device 404 has two bearing bolts 902 as support components.

As indicated above, the system support 102 includes one or more than one cavity 102h, e.g., a first cavity into which the adjustment device 150s extends, e.g., in which the adjustment device 150s is disposed. The first cavity 102h may face the magnets 104, for example. Optionally, the system support 102 includes a second cavity 102h on a side opposite the first cavity 102h. The second cavity 102h may be spatially separated from the first cavity 102h, for example by means of a wall (e.g., plate) of the system carrier 102.

The magnet system 100 may include two or more support devices 404 (e.g., one support device 404 per bearing location), each support device 404 including two bearing bolts 902 as support components between which the system support 102 is disposed. Each of the bearing bolts 902 may protrude from the system support 102.

In an exemplary implementation, the system carrier 102 to which the two or more support devices 404 are mounted is inserted into the housing 406g (e.g., its housing tube 604), e.g., by positively engaging each of the support devices 404 in the guide groove of the guide rails. The system support 102 is positively supported in each guide rail of the bearing frame 414 by means of the bearing pins 902.

Figure 9:
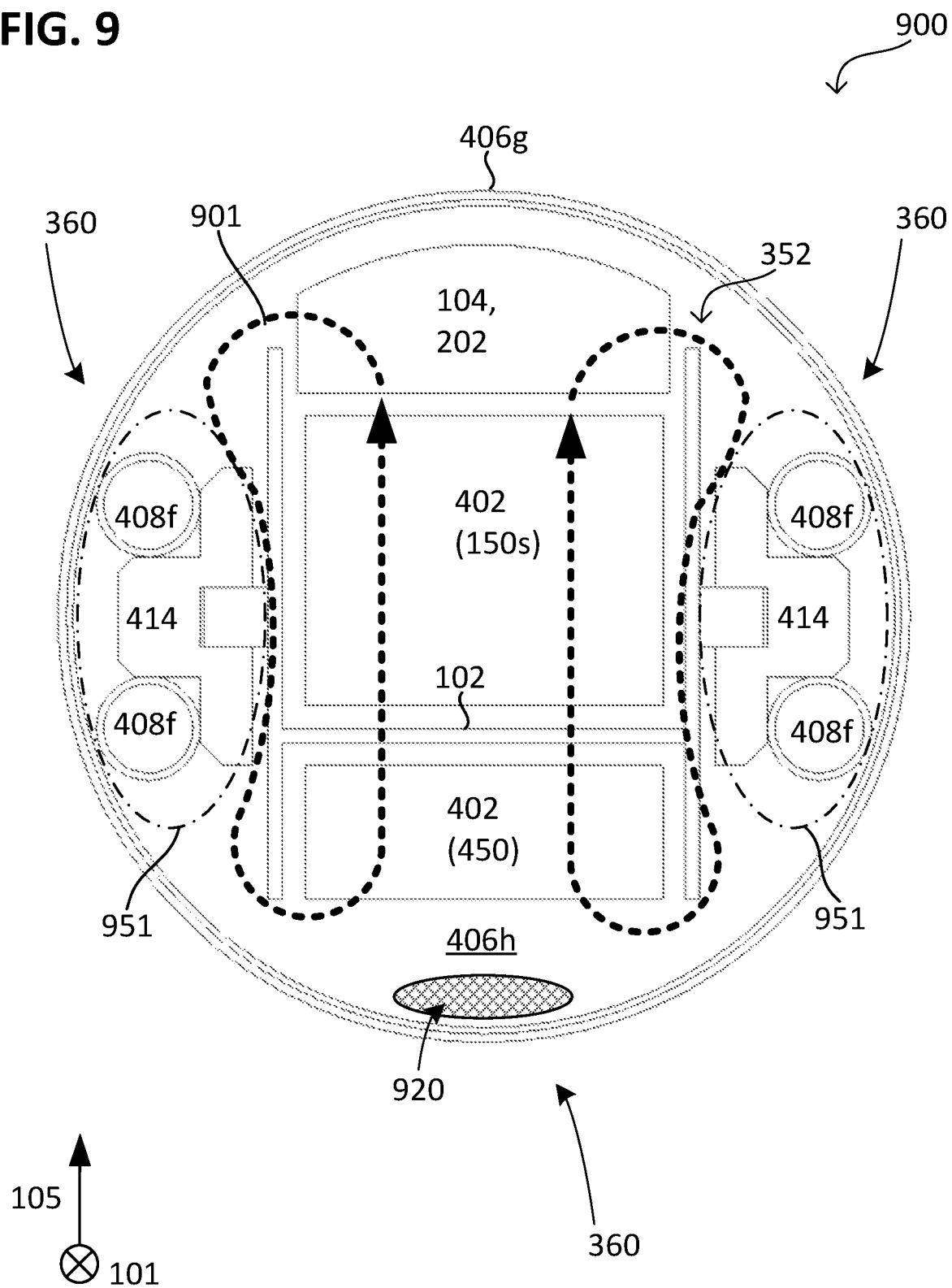

FIG. 9 illustrates the magnet system 100 according to various embodiments 900 in a schematic side view or cross-sectional view (looking along the reference direction), illustrating gas transport 901 in the housing interior 406h. Generally, a gas (also referred to as a housing gas), such as a mixture of gases (e.g., air), may be disposed in the housing interior 406h, or the magnet bar 352 may be exposed to the housing gas. The enclosure gas may comprise, for example, an earth-atmospheric composition (then also referred to as air) or at least nitrogen, and may further optionally comprise gaseous water (then also referred to as water vapor or moisture, e.g., humidity).

Illustratively, the housing 406g and the condensation trap 408 (or its coolant guide) may be configured such that the interior of the housing 406h is adjacent to a plurality of surfaces that differ in temperature from one another (more illustratively hereinafter also referred to as low temperature surfaces and high temperature surfaces). In operation, the condensation trap 408 may have or provide one or more than one low temperature surface. The magnet system 100 (e.g., one or more than one electrical component 402 thereof and/or the housing 406g) may, in operation, have or provide one or more than one higher temperature surface.

In an exemplary implementation, the gas transport 901 may be formed by a flow pattern 901 or circulation of the enclosure gas. In this case, the gas transport is excited by free convection, e.g., due to the temperature-dependent density differences of the enclosure gas. The enclosure gas is heated at the surfaces of high temperature. The heated enclosure gas then absorbs moisture. When the moist enclosure gas then flows past a surface of lower temperature, it is cooled to such an extent that the moisture precipitates on the surface of lower temperature.

Illustratively, the one or more than one low temperature surface provides a condensate trap to reduce the humidity of the enclosure interior 406h or collect the humidity as condensate (e.g., water separated as a liquid). The low and high temperature surfaces further stimulate convection 901 of the gas in the enclosure interior 406h, which aids in gas transport 901. The enclosure gas is heated at the high temperature surfaces. The heated enclosure gas then absorbs moisture at lower temperature surfaces. As the moist enclosure gas then flows past a cold surface, it is cooled to the point where the moisture precipitates on the cold surfaces.

The gas transport 901 causes the enclosure gas to be mixed within the enclosure interior 406h and the water to be adsorbed onto lower temperature surfaces (also referred to as deposition). Convection 901 of the enclosure gas (e.g., air circulation) alternatively or additionally provides temperature control of the magnet system 100 (e.g., one or more than one electrical component 402 thereof) or components with higher heat generation.

The temperature difference between lower temperature surfaces and high temperature surfaces stimulates a heat flow from the high temperature surfaces to the lower temperature surfaces. The heat flow occurs by means of convection 901 of the enclosure gas, with heat transfer between the surfaces and the enclosure gas occurring via conduction. The density of the enclosure gas is a function of the temperature of the enclosure gas, thereby stimulating mass transfer and hence convection 901, which improves heat transfer compared to an enclosure gas at rest. The saturation concentration of the water vapor is an exponential function of the temperature of the enclosure gas and thus influences the ratio of evaporation to condensation of the water.

In the exemplary implementation, the condensation trap 406 or at least its fluid conduit(s) 408$f$ are in physical contact (e.g., attached to each other) with the bearing rack 414 or at least its bearing component(s) 414$a$, 414$b$. This increases the stiffness of the magnet system 100 and increases the low-temperature surfaces and thus the effective area for condensate deposition. For example, the guide rail 414$a$ and the cooled fluid line(s) 408$f$ are welded together.

As an illustrative example, the components having the lower temperature surfaces may be understood as the heat sink 951 and the housing tube 406$g$ having the higher temperature surface(s) may be understood as the heat source. Since the fluid line(s) 408$f$ of the condensation trap 408 have cold cooling fluid flowing through them, and the housing tube 406$g$ has warm cooling fluid flowing around it, a plurality of surfaces of different temperatures are present in the magnet system 100. This is exploited to deposit (i.e., condense) moisture in the housing interior 406$h$ on the lower temperature surfaces, causing condensation to form on the lower temperature surfaces. This removes moisture from the enclosure gas (e.g., air) in the enclosure housing interior 406$h$, thereby reducing the moisture load on the electrical components 402.

In an exemplary implementation, the bearing rack 414 (e.g., its bearing components 414$a$, 414$b$) may be formed of corrosion-resistant steel so that it is more resistant to moisture that is deposited. Corrosion resistant steel may be configured to be self-passivating, for example, by having or forming a conversion layer (e.g., oxide layer). More generally, the bearing rack 414 (e.g., its bearing components 414$a$, 414$b$) may be configured to be self-passivating or formed from a self-passivating material (e.g., for stainless steel, aluminum, and/or titanium). The self-passivation forms a natural conversion layer which reduces the corrosion rate of the self-passivating material.

If a particularly large amount of moisture is condensed, droplets may form. Gravity may cause these drops to fall into the lower portion of the housing 406$g$, or in the case of an obliquely oriented magnet system 100, these drops may fall onto the system support 102. The droplet formation may result in fluid accumulation, and a condensate reservoir 920 may optionally be disposed in the interior of the housing 406$h$ to store the condensate. For example, the condensate storage 920 may comprise or consist of a container, a hygroscopic material, and/or a porous body (e.g., a sponge). For example, the condensate reservoir 920 may be configured to bind (e.g., absorb and/or adsorb) water (e.g., chemically and/or physically).

Examples of materials for condensate storage 920 that provide physical bonding of water include: sponge, fibrous material (e.g., paper). Examples of materials for condensate storage 920 that provide chemical bonding of water include: Silica gel, salt (e.g., $CaCl_2$). However, when using the chemical bond, it should be noted that the reaction product with water may be chemically aggressive (e.g., have acid or alkali), which may cause damage to the components.

If the condensation trap is subject to the formation of droplets due to high humidity, which collect at the lowest point of the housing tube 406$g$, then a sponge, gel or similar storage material may be arranged at this point, for example, which binds the liquid at this point.

The condensate reservoir 920 may inhibit fluid in the housing 406$g$ from flowing uncontrollably during an operation involving movement of the magnet system 100, such as target replacement or other maintenance.

Figure 10:
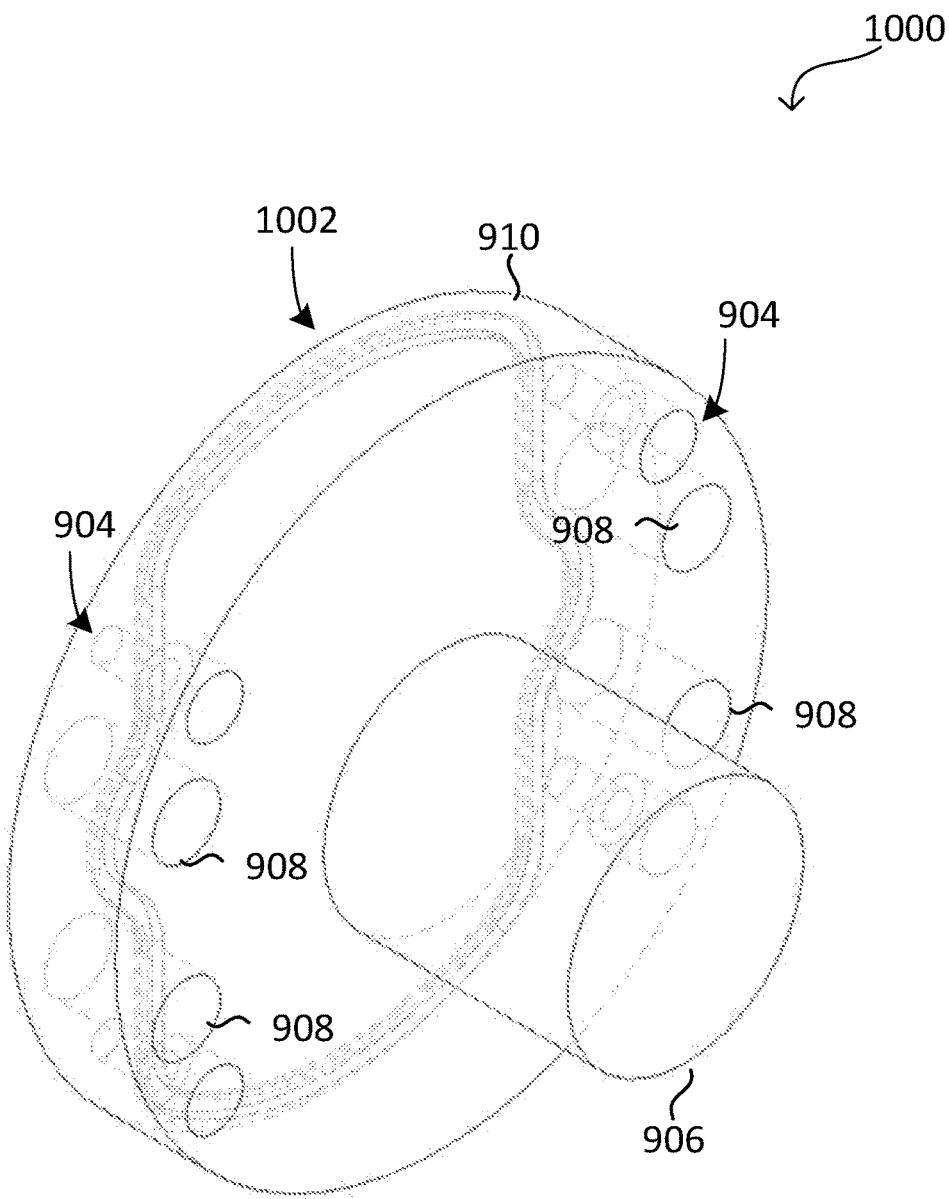
FIGS. 10 and 11 each show a housing cover according to different embodiments in a schematic perspective view.

FIG. 10 illustrates a terminal cover 406$d$ of the magnet system 100 according to various embodiments 1000 in a schematic perspective view, e.g., a first terminal cover.

The (e.g., first) connection cover 406$d$ may have a sealing surface 1002 (e.g., having a groove for receiving a seal) (e.g., matching the flange of the housing tube). For example, an elastomeric seal may bear against the sealing surface 1002, such as being received in the groove.

The (e.g., first) terminal cover 406$d$ may have one or more than one mounting area 904 (e.g., each having a through-hole), each mounting area 904 being configured to mate with the flange 606 such that the terminal cover 406$d$ may be mounted to the mounting area 606$m$ of the flange 606 by means of its mounting area 904 (for axial mounting of the terminal cover). For example, the terminal cover 406$d$ may be bolted to the flange 606 by means of mounting bolts extending through the through-holes in the terminal cover 406$d$.

For example, the (e.g., first) connection lid 406$d$ may include a (e.g., plate-shaped) lid base body 910 that includes or comprises a flange (also referred to as a lid flange). The lid base body, e.g., its flange, may include the one or more than one mounting area 904 and/or sealing surface 1002.

Further, the (e.g., first) terminal cover 406$d$ includes a support device 906 (e.g., protruding from the cover base body 910) (also referred to as the cover support device 906), such as including a bearing journal. The lid support device 906 may be configured to form a bearing, such as a fixed bearing, when mated with the target bearing device 350 (e.g., one of the end blocks 312$a$, 312$b$). For example, the lid support device 906 may be or may be received in a recess of an end block.

In this regard, it should be noted that the lid support device 906 (e.g., the bearing journal) need not necessarily be arranged centrally (e.g., concentrically with respect to the lid base body 910). For example, the lid support device 906 may be offset by a few millimeters from the axis of rotation 311 and/or from the geometric center of the lid base body 910. This achieves that the housing tube 604 is not concentrically arranged in the target tube, which allows to bring the magnet system 100 closer to the target material, thus achieving a higher field strength at the target surface.

Further, the (e.g., first) port cover 406$d$ includes one or more than one fluid port 908 that is fluidly coupled to the condensation trap 408, e.g., its fluid conduit(s) 408$f$, when the system chamber 406 is assembled. For example, each fluid port 908 may be penetrated by a through-hole.

According to various embodiments, the (e.g., first) port cover 406$d$ may include, e.g., per port opening 606$o$, a fluid port 908 fluidly coupled to (e.g., continuing and/or opening into) the port opening 606$o$ when the system chamber 406 is assembled. In the case, each fluid port 908 may include a through-hole penetrating the lid base body 910.

In an exemplary implementation of the two-cover configuration, the first port cover 406$d$ and the second port cover 406$d$ may be configured the same as each other, for example, configured according to embodiments 1000. For example, like the first terminal cover 106$d$, the second terminal cover 106$d$ may include a bearing journal 906, a seal receptacle, and holes 908 for mounting screws. However, instead of having one or more than one fluid port 908, the second port cover 406d may have only one through-hole, or the fluid port 908 may be exposed so that the coolant fluid may flow out of the second port cover 406d into the interior of the target and flow back (more commonly referred to as return) through the annular gap between the housing tube 406g and the target 302 to the media end block, thereby absorbing the waste heat from the target 302. As the coolant temperature rises during the return flow, the housing 406g is also heated.

For example, the cooling fluid delivered to the magnet system 100 (e.g., the condensation trap 408 thereof) may have a first temperature (e.g., of about 45° C. or less, e.g., 25° C. or less). For example, the cooling fluid delivered from the magnet system 100 may have a second temperature (e.g., greater than the first temperature by at least ΔT). For example, after the cooling fluid is dispensed from the magnet system 100 and flows back through the target (also referred to as return flow), the cooling fluid may have a third temperature (e.g., by at least 2–ΔT) greater than the first temperature. For example, the third temperature may be 65° C. For example, ΔT=10 Kelvin or more, e.g., 20 Kelvin or more.

An initial temperature (also referred to as input temperature) of 25° C. or more (e.g., approximately 45° C.) allows the target material to be tempered, thereby inhibiting condensation on the target material.

Figure 11:
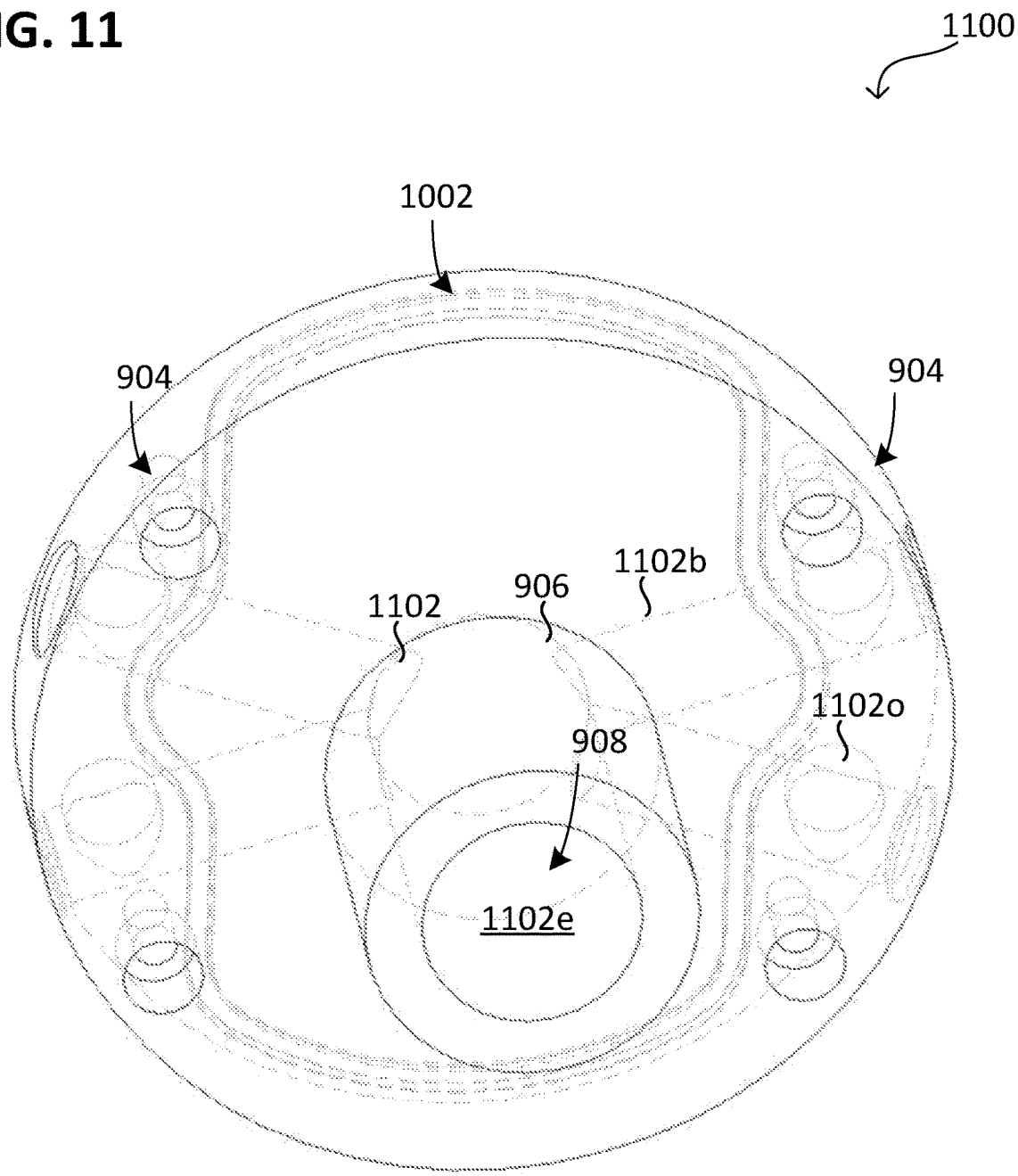

FIG. 11 illustrates a connection lid 406d of the magnet system 100 according to various embodiments 1100 in a schematic perspective view configured as 1000, except that connection lid 406d, e.g., its lid support device 906, comprises (e.g., exactly) a fluid port 908 and a fluid manifold 1102 that couples each connection port 606o to the fluid port 908 when the system chamber 406 is assembled. For example, the fluid manifold 1102 may include a plurality of output ports, each output port opening into a port opening 606o.

In an exemplary implementation of the fluid distributor 1102, the fluid distributor 1102 has a plurality of bores, a first bore 1102e of which penetrates the connecting pin 906 for coolant supply from the end block, four second bores 1102b extend radially outward from the first bore and open into four third bores 1102o. The cooling fluid is thus directed from the entrance of the first bore 1102e to the four third bores 1102o and distributed to them. The four third bores 1102o are arranged such that they may be coupled to the fluid lines 408f.

In an exemplary implementation of the two-lid configuration, the first terminal lid 406d and the second terminal lid 406d may be configured differently from each other. For example, and the first port lid 406d may be configured according to embodiments 1100 and the second port lid 406d may be configured according to embodiments 1000. Also in this case, instead of having one or more than one fluid port 908, the second port cover 406d may have only one through-hole, or the fluid port 908 may be exposed so that the cooling fluid may flow out of the second port cover 406d into the interior of the target and flow through the annular gap between the housing tube 406g and the target tube back to the media end block, thereby absorbing the waste heat from the target.

Various more general implementations of the magnet system 100 are explained below. In this regard, it should be noted that the magnet system 100 does not necessarily have to include the condensation trap 408 as the dehumidifying device 360, but may do so.

In other implementations of the dehumidifying device 360, the dehumidifying device 360 may alternatively or additionally include (e.g., only) the hygroscopic material adjacent to or disposed within the housing interior 406 (also referred to as the housing interior). Illustratively, for example, if the moisture in the housing interior 406 is low, the hygroscopic material may be sufficient to trap the moisture in the housing interior 406.

Examples of hygroscopic material providing physical binding of water include: sponge, fibrous material (e.g. paper). Examples of hygroscopic material providing chemical binding of water include: Silica gel, salt (e.g. $CaCl_2$). However, when using chemical bonding, it should be noted that the reaction product with water may be chemically aggressive (e.g. have acid or alkali), which may lead to damage to the components.

For example, the humidity in the housing 406g may also be temporarily reduced with a desiccant as hygroscopic material, which is changed after a defined time.

In still other implementations of the magnet system 100, as an alternative to or in addition to the dehumidifying device 360 (e.g., condensation trap 408 and/or hygroscopic material 920), the magnet system 100 may comprise a low-water content fluid (also referred to simplistically as fluid or housing fluid), e.g., dehumidified gas (also referred to as dry gas, e.g., dry air), with which the housing interior 406h is filled and/or in which the magnet holder 102 or magnets 104 are embedded. This achieves that the amount of water in the housing interior 406h is particularly small. For example, the enclosure fluid, e.g., the dehumidified gas, may have a mole fraction (e.g., stated as mole fraction) of water that is less than about 1%, e.g., less than about 0.5%, e.g., less than about 0.2%. Dried compressed air has water contents in a range from about 0.5 $g/m^3$ to about 10 $g/m^3$ (grams per cubic meter). A technical gas, such as nitrogen, has a purity of about 99.8% or higher.

For example, the low-water housing fluid may be gaseous (then also referred to as low-water housing gas), e.g., consisting of dry air or consisting essentially of nitrogen, or liquid (e.g., consisting of oil).

Illustratively, the system chamber 406 or its housing tube 406g may be filled with a dry housing gas (e.g., of nitrogen). However, it may be necessary to repeat the filling of the system chamber 406 or its housing tube 406g after each maintenance, which may be costly and may be unreliable, for example, if the tightness system chamber 406 is unreliable.

To reduce this effort and/or to increase reliability, the magnet system 100 may have (alternatively or in addition to the one or more than one fluid port 908) two additional fluid ports (not shown) (e.g., on the housing cover 406d), which are fluidly coupled to each other by means of the housing interior 406h, e.g., which open into the housing interior 406h. By means of the two additional fluid ports, the low-water housing fluid (e.g., dry air) may be supplied to or withdrawn from housing interior 406h. For example, housing interior 406h may be connected by means of the two additional fluid connections to two hoses, which are led to the outside via one or more than one end block. This may provide a permanent flow of dry air (also referred to as dry air) or other gas through the housing tube 106g.

In still other implementations of the magnet system 100, the magnet system 100 may include (as an alternative to or in addition to the dehumidifying device 360, the low water housing fluid, and/or the hygroscopic material 920) an encapsulation. The encapsulation may be disposed in the housing interior 406h and may enclose the one or more than one component 402 of the magnet system 100, such as one or more than one circuit. Optionally, the encapsulation may be adjacent to or at least partially materially bonded by means of the system support 102. For example, the water-sensitive components of the magnet system may be encapsulated (e.g., potted with resin) to inhibit contact with moisture.

With respect to what is described herein, it should also be noted that the condensation trap 408 need not necessarily be supplied with a cooling fluid from outside the magnet system (or target). The condensation trap 408 may have a (e.g., electrically supplied) cooling device (not shown) as an alternative or in addition to the fluid lines 408f. The cooling device may comprise, for example, a compression refrigerator, a heat exchanger, an absorption refrigerator, and/or a thermoelectric converter (e.g., comprising one or more than one Peltier element). This achieves cooling independent of the cooling fluid for condensate separation, thereby improving the reliability of the magnet system 100.

The magnet system provided is very compact and space-optimized, as conventional components (e.g. a cooling water guide) may take over the function of a dehumidifying device 360 or a condensate separator. The thermal decoupling of the guide rails from the housing tube 406g improves the function of the condensate separator. With other designs of the housing tube, e.g. with a multi-chamber profile, only very small temperature differences at the wall temperatures may be realized.

Optionally, operation of the dehumidifying device 360 may be controlled and/or regulated by means of a humidity sensor disposed within the enclosure interior 406h. Alternatively or additionally, the replacement of the low-water housing fluid (e.g., housing gas) with which the housing interior is filled may be based on a chemical composition of the housing interior captured by the moisture sensor.

In the following, various examples are described that relate to what has been described above and what is shown in the figures.

Example 1 is a magnet system for a sputtering device, the magnet system comprising: a (e.g. elongated, non-magnetic and/or tubular) housing having a housing interior; and a (e.g. elongated, non-magnetic and/or profiled) magnet holder disposed in the housing interior and supported by means of the housing (e.g. a refrigerator); the magnet system further comprising one or more of the following (e.g., stationary thereto and/or rotationally secured thereto); the magnet system further comprising one or more of: a dehumidifying device (e.g., a condensation trap) adjacent to or disposed within the housing interior for drying the housing interior; a low water content fluid (e.g., dry air) disposed within the housing interior and supported by the housing (e.g., stationary thereto and/or rotationally secured thereto); and a magnetic carrier (e.g., elongated non-magnetic and/or profiled) disposed within the housing interior and supported by the housing (e.g., stationary thereto and/or rotationally secured thereto); the magnet system further comprising one or more of the following a low-water fluid (e.g., dry air) disposed in the housing interior and/or in which the magnet holder is at least partially (i.e., partially or fully) embedded; a circuit (e.g., providing and/or powering control electronics and/or an electromagnetic transducer) disposed in the housing interior and (e.g., common to the magnet holder and/or the magnet carrier) for drying the housing interior. (e.g., together with the magnet holder or at least partially by means of the magnet holder); and/or a humidity sensor adjacent to or disposed within the housing interior for capturing a chemical composition (e.g., the humidity) of the housing interior.

Example 2 is the magnet system according to example 1, wherein the dehumidifying device comprises or consists of a condensation trap (e.g., comprising a refrigeration machine and/or a fluid line or a cooling fluid).

Example 3 is the magnet system according to example 1 or 2, wherein the dehumidifying device comprises a hygroscopic material.

Example 4 is the magnet system according to any of examples 1 to 3, wherein the dehumidifying device has two fluid ports fluidly connected to each other by means of the housing interior (to dehumidify the housing interior by means of bringing out the fluid disposed therein).

Example 5 is the magnet system according to any of examples 1 to 4, wherein the low-water fluid has a molar fraction of water (e.g., gaseous water) of less than 1%.

Example 6 is the magnet system according to any of examples 1 to 5, wherein the dehumidifying device is configured as a dehumidifier.

Example 7 is the magnet system according to any of examples 1 to 6, further comprising: a plurality of magnets held in the housing interior by means of the magnet holder and/or and (e.g., jointly and/or monolithically with the circuit) encapsulated in a waterproof manner.

Example 8 is the magnet system of example 7, further comprising a plurality of assemblies, each assembly comprising: at least one magnet of the plurality of magnets; an actuator (e.g., comprising circuitry) by means of which the at least one magnet is coupled to the magnet holder, the actuator being configured to be controlled in response to changing a spatial relationship of the at least one magnet relative to the magnet holder.

Example 9 is the magnet system according to example 8, wherein the magnet holder comprises a first cavity into which the actuator is extended; wherein the magnet holder preferably comprises a second cavity which is separated (spatially and/or by means of a wall of the magnet holder) from the first cavity (in which, for example, the circuit is arranged).

Example 10 is the magnet system according to any of examples 1 to 9, wherein the housing comprises a tubular base body penetrated by the housing interior from a first end face to a second end face of the housing and/or wherein the housing comprises a flange on the first end face and/or the second end face.

Example 11 is the magnet system according to any of examples 1 to 10, wherein the housing or at least its base body is spaced from the condensation trap or is at least thermally decoupled therefrom.

Example 12 is the magnet system according to any one of examples 1 to 11, further comprising: a fluid port coupled to the dehumidifying device (e.g., the condensation trap) for supplying it with a cooling fluid.

Example 13 is the magnet system according to example 12, further comprising: a (preferably cap-shaped) housing cover forming a (e.g., fluid-tight, e.g., vacuum-tight) chamber when mated with the housing, wherein the housing cover comprises the fluid port; wherein the housing cover preferably comprises a fluid manifold.

Example 14 is the magnet system according to any of examples 1 to 13, wherein the dehumidifying device (e.g., the condensation trap) comprises at least one fluid conduit adjacent to or disposed within the housing interior.

Example 15 is the magnet system according to any of examples 1 to 14, further comprising: two bearing journals (e.g. provided by means of the housing cover) between which the housing interior is arranged.

Example 16 is the magnet system according to any one of examples 1 to 15, further comprising: a bearing rack in the housing by means of which the magnet holder is supported (e.g. providing it with one or more than one bearing location), the bearing rack being conductively coupled to (e.g. contacting) the condensation trap (e.g. a fluid conduit thereof); wherein the bearing rack preferably comprises one or more than one profile rail (e.g. grooved profile).

Example 17 is the magnet system according to any of examples 1 to 16, wherein the humidity sensor is configured to capture a humidity of the housing interior.

Example 18 is the magnet system according to any one of examples 1 to 17, further comprising: a condensation trap (e.g. comprising a hygroscopic material or a sponge) configured to trap and/or store condensate deposited from the condensation trap, the condensation trap preferably comprising a porous body.

Example 19 is the magnet system according to any one of examples 1 to 18, wherein the housing has a first end face and a second end face opposite thereto, the condensation trap being coupled to (and spatially separated from) the first end face and the second end face of the housing, preferably only.

Example 20 is the magnet system according to any of examples 1 to 19, wherein the housing and/or the housing cover comprises an electrical connection or feedthrough for introducing electrical power into the housing (e.g., to power the circuit).

Example 21 is a method for dehumidifying the magnet system according to any one of examples 1 to 20, comprising: bringing out of the housing interior a first fluid (e.g., gas) with which the housing interior is filled and/or in which the magnet holder is embedded; bringing into the housing interior a second fluid (e.g., gas) with which the housing interior is filled and/or in which the magnet holder is embedded; wherein the second fluid comprises a lower molar fraction of water (gaseous water) than the molar fraction of water (gaseous water) with which the housing interior is filled and/or in which the magnet holder is embedded from the housing interior; introducing a second fluid (e.g. gas), with which the housing interior is filled and/or in which the magnet holder is embedded, into the housing interior; wherein the second fluid comprises a lower molar fraction of water (gaseous water) than the first fluid and/or wherein the second fluid comprises a higher molar fraction of liquid water than the first fluid; wherein the dehumidifying (comprising the introducing out and/or introducing in) is preferably based on a chemical composition (e.g. humidity) of the housing interior captured by the humidity sensor.

Example 22 is a sputtering device comprising: a bearing device, preferably comprising one or more than one end block, for rotatably supporting a sputtering target; the magnet system according to any one of examples 1 to 20 being fixedly (e.g., rigidly) supported relative to the bearing device within the sputtering target.

Example 23 is the sputtering device of example 22, the bearing device further comprising: a fixed bearing supporting the magnet system; a rotary bearing for rotatably supporting the sputtering target.

Example 24 is the sputtering device of example 23, the bearing device further comprising: a coupling rotatably supported by the pivot bearing for coupling the sputtering target, the coupling having a through-hole into which the fixed bearing extends.

The invention claimed is:

1. A sputtering device comprising end blocks and a magnet system disposed between the end blocks, the magnet system comprising:
   a housing comprising a housing interior;
   a magnet holder arranged in the housing interior and supported by means of the housing; and
   a dehumidifying device adjacent to or disposed within the housing interior for dehumidifying the housing interior.

2. The puttering device of claim 1, wherein the dehumidifying device comprises a condensation trap.

3. The sputtering device of claim 2, the magnet system further comprising a fluid port coupled to the condensation trap for supplying the condensation trap with a cooling fluid.

4. The sputtering device of claim 2, wherein the condensation trap comprises a sponge configured to trap condensate, wherein the sponge is porous.

5. The sputtering device of claim 1, wherein the dehumidifying device comprises a hygroscopic material.

6. The sputtering device of claim 1, wherein the dehumidifying device comprises two fluid ports fluidly connected to each other by means of the housing interior.

7. The sputtering device of claim 1, wherein the magnet holder is fixedly attached to the housing.

8. The sputtering device of claim 1, the sputtering device further comprising a sputtering target and a bearing device, wherein the bearing device comprises the end blocks for rotatably supporting the sputtering target, wherein the magnet system is located within the sputtering target and rotationally mounted with respect to the bearing device.

9. The sputtering device of claim 1, the magnet system further comprising a low-water fluid with the housing interior, wherein the magnet holder is at least partially embedded in the low-water fluid, wherein the low-water fluid has a water content of less than 1%.

10. The sputtering device of claim 1, the magnet system further comprising a circuit arranged in the housing interior and encapsulated in a watertight manner.

11. The sputtering device of claim 1, the magnet system further comprising a humidity sensor adjacent to or disposed within the housing interior for capturing a chemical composition of the housing interior.

12. The sputtering device of claim 1, the magnet system further comprising a plurality of magnets which are held within the housing interior by means of the magnet holder.

13. The sputtering device of claim 12, the magnet system further comprising a plurality of assemblies, each assembly comprising:
   at least one magnet of the plurality of magnets; and
   an actuator that couples the at least one magnet to the magnet holder, wherein the actuator is configured to be controlled in response to changes in a spatial relationship of the at least one magnet relative to the magnet holder.

14. The sputtering device of claim 13, wherein the magnet holder comprises:
   a first cavity into which the actuator extends; and
   a second cavity that is spatially separated from the first cavity.

15. The sputtering device of claim 1, wherein the housing comprises a tubular base body penetrated by the housing interior from a first end face to a second end face of the housing, wherein the housing comprises a flange on the first end face or the second end face.

16. The sputtering device of claim 1, wherein the dehumidifying device is thermally decoupled from the housing.

17. The sputtering device of claim 1, the magnet system further comprising:
- a fluid port coupled to the dehumidifying device for supplying the dehumidifying device with a cooling fluid; and
- a housing cover configured to mate with the housing and to, when mated, form a fluid-tight chamber within the housing.

18. The sputtering device of claim 1, wherein the housing has a first end face and a second end face opposite thereto, wherein the dehumidifying device is coupled to and spatially separated from the first end face and the second end face of the housing.

19. A method for dehumidifying a magnet system that is disposed between end blocks of a sputtering device, the method comprising:
- extracting from a housing interior of the magnet system a first fluid with which the housing interior is filled and in which a magnet holder of the magnet system is embedded; and
- introducing a second fluid into the housing interior, wherein the second fluid has a lower molar fraction of gaseous water or a higher molar fraction of liquid water than the first fluid.

20. A magnet system for a sputtering device, the magnet system comprising:
- a housing comprising a housing interior;
- a magnet holder arranged in the housing interior and supported by means of the housing;
- a dehumidifying device adjacent to or disposed within the housing interior for dehumidifying the housing interior; and
- a bearing rack that supports the magnet holder within the housing, wherein the bearing rack is conductively coupled to the dehumidifying device, wherein the bearing rack comprises a grooved profile.

* * * * *

UNITED STATES PATENT AND TRADEMARK OFFICE
CERTIFICATE OF CORRECTION

PATENT NO. : 12,165,857 B2
APPLICATION NO. : 18/054562
DATED : December 10, 2024
INVENTOR(S) : Klaus Schneider et al.

Page 1 of 1

It is certified that error appears in the above-identified patent and that said Letters Patent is hereby corrected as shown below:

In the Claims

Claim 2, Column 22, Line 10: Replace "puttering" with --sputtering--

Signed and Sealed this
Twenty-first Day of January, 2025

Coke Morgan Stewart
*Acting Director of the United States Patent and Trademark Office*